United States Patent
Ogura et al.

(10) Patent No.: US 11,888,464 B2
(45) Date of Patent: *Jan. 30, 2024

(54) VIBRATION ELEMENT, PHYSICAL QUANTITY SENSOR, INERTIAL MEASUREMENT UNIT, ELECTRONIC APPARATUS, AND VEHICLE

(71) Applicant: SEIKO EPSON CORPORATION, Tokyo (JP)

(72) Inventors: Seiichiro Ogura, Minowa (JP); Keiichi Yamaguchi, Ina (JP); Masahiro Oshio, Shiojiri (JP); Takashi Yamazaki, Shiojiri (JP)

(73) Assignee: SEIKO EPSON CORPORATION

( * ) Notice: Subject to any disclaimer, the term of this patent is extended or adjusted under 35 U.S.C. 154(b) by 0 days.

This patent is subject to a terminal disclaimer.

(21) Appl. No.: 18/081,084

(22) Filed: Dec. 14, 2022

(65) Prior Publication Data

US 2023/0109944 A1    Apr. 13, 2023

Related U.S. Application Data

(63) Continuation of application No. 17/243,632, filed on Apr. 29, 2021, now Pat. No. 11,595,026, which is a
(Continued)

(30) Foreign Application Priority Data

Jan. 23, 2018    (JP) ................. 2018-009173

(51) Int. Cl.
*H03H 9/21*    (2006.01)
*H03H 3/02*    (2006.01)
(Continued)

(52) U.S. Cl.
CPC ........... *H03H 9/21* (2013.01); *G01C 19/5607* (2013.01); *G01C 19/5621* (2013.01);
(Continued)

(58) Field of Classification Search
CPC ............ G01C 19/5607; G01C 19/5621; G01C 19/5656; G01C 19/5628; G01C 19/5663;
(Continued)

(56) References Cited

U.S. PATENT DOCUMENTS 8,304,968 B2    11/2012    Tanaya
8,330,560 B2    12/2012    Matsudo
(Continued)

FOREIGN PATENT DOCUMENTS

JP    2006-311444 A    11/2006
JP    2008-054273 A    3/2008
(Continued)

*Primary Examiner* — Helen C Kwok
(74) *Attorney, Agent, or Firm* — Harness, Dickey & Pierce, P.L.C.

(57) ABSTRACT

A vibration element includes a base and a vibrating arm extending from the base. The vibrating arm includes an arm positioned between the base and a weight. A weight film is disposed on the weight. The weight has a first principal surface and a second principal surface in a front and back relationship with respect to a center plane of the arm. A center of gravity of the weight is located between the first principal surface and the center plane of the arm. A center of gravity of the weight film is located between the second principal surface and the center plane of the arm.

14 Claims, 23 Drawing Sheets

Related U.S. Application Data continuation of application No. 16/253,712, filed on Jan. 22, 2019, now Pat. No. 11,025,222.

(51) Int. Cl.

| | | |
|---|---|---|
| *H03H 9/05* | (2006.01) | |
| *G01C 19/5607* | (2012.01) | |
| *H03H 3/04* | (2006.01) | |
| *H03H 9/10* | (2006.01) | |
| *G01C 19/5621* | (2012.01) | |
| *G01C 19/5628* | (2012.01) | |
| *G01C 19/5663* | (2012.01) | |
| *G01C 19/5656* | (2012.01) | |

(52) U.S. Cl.
CPC ..... *G01C 19/5628* (2013.01); *G01C 19/5656* (2013.01); *G01C 19/5663* (2013.01); *H03H 3/02* (2013.01); *H03H 3/04* (2013.01); *H03H 9/0533* (2013.01); *H03H 9/0547* (2013.01); *H03H 9/0595* (2013.01); *H03H 9/1014* (2013.01); *H03H 2003/026* (2013.01); *H03H 2003/0492* (2013.01)

(58) Field of Classification Search
CPC .......... H03H 9/21; H03H 9/0595; H03H 3/02; H03H 3/04
See application file for complete search history.

(56) References Cited

U.S. PATENT DOCUMENTS

| | | | |
|---|---|---|---|
| 11,025,222 B2 * | 6/2021 | Ogura | ............... H03H 9/21 |
| 11,595,026 B2 * | 2/2023 | Ogura | ............... H03H 9/0547 |
| 2005/0011267 A1 | 1/2005 | Kikuchi | |
| 2009/0178260 A1 | 7/2009 | Yamazaki et al. | |
| 2010/0156237 A1 | 6/2010 | Ichikawa et al. | |
| 2010/0201229 A1 | 8/2010 | Saito | |
| 2011/0025166 A1 | 2/2011 | Aratake | |
| 2012/0039153 A1 | 2/2012 | Kobayashi | |
| 2012/0075962 A1 | 3/2012 | Arimatsu | |
| 2013/0255379 A1 | 10/2013 | Nakagawa et al. | |
| 2014/0020503 A1 | 1/2014 | Yamaguchi et al. | |
| 2015/0040664 A1 | 2/2015 | Ishii | |
| 2015/0188514 A1 | 7/2015 | Yamada et al. | |
| 2015/0188515 A1 | 7/2015 | Yamada et al. | |
| 2016/0268996 A1 | 9/2016 | Kobayashi et al. | |
| 2016/0344362 A1 | 11/2016 | Kobayashi | |
| 2017/0227566 A1 | 8/2017 | Gregory | |

FOREIGN PATENT DOCUMENTS

| | | |
|---|---|---|
| JP | 2010-147954 A | 7/2010 |
| JP | 2010-213262 A | 9/2010 |
| JP | 2013-126104 A | 6/2013 |
| JP | 2015-035734 A | 2/2015 |
| JP | 2015-090275 A | 5/2015 |
| JP | 2016-186479 A | 10/2016 |
| JP | 2017-142249 A | 8/2017 |

* cited by examiner

VIBRATION ELEMENT, PHYSICAL QUANTITY SENSOR, INERTIAL MEASUREMENT UNIT, ELECTRONIC APPARATUS, AND VEHICLE

CROSS-REFERENCE

This application is a continuation application of U.S. patent application Ser. No. 17/243,632 filed Apr. 29, 2021, which is a continuation application of U.S. patent application Ser. No. 16/253,712 filed on Jan. 22, 2019, now U.S. Pat. No. 11,025,222 issued on Jun. 1, 2021, which claims the benefit of priority from, JP Application No. 2018-009173, filed Jan. 23, 2018. The entire disclosures of the above applications are incorporated herein by reference.

BACKGROUND

1. Technical Field

The present invention relates to a vibration element, a manufacturing method of the vibration element, a physical quantity sensor, an inertial measurement device, an electronic apparatus, and a vehicle.

2. Related Art

In the related art, a vibration element used for a device such as a quartz crystal vibrator, a vibration type gyro sensor, or the like is known. A tuning fork type quartz crystal vibrator element described in JP-A-2006-311444, which is an example of such a vibration element, includes a base and a pair of vibrating arms which are bifurcated from the base and extend parallel to each other. Here, the tip end of the vibrating arm is provided with a weight which is processed to a thickness thinner than a thickness of an arm of the vibrating arm, and a metal film for adjusting a frequency of the tuning fork type quartz crystal vibrator element is provided in the weight. A tuning fork type piezoelectric vibrator element described in JP-A-2010-213262 includes a base and a pair of vibrating arms which are bifurcated from the base and extend parallel to each other, and a portion whose thickness is thinner than a predetermined thickness is formed in a weight at the tip end of which the width is enlarged greater than the width of the arm of the vibrating arm. In the weight, a metal film used for frequency adjustment is provided on both the upper and lower surfaces of the weight.

However, in the tuning fork type quartz crystal vibrator elements described in JP-A-2006-311444 and JP-A-2010-213262, since the center of gravity of a structure composed of the weight and the metal film is shifted in the thickness direction with respect to a center plane in the thickness direction of the arm of the vibrating arm, when the pair of vibrating arms vibrate in a direction (in-plane direction) of approaching or separating from each other, the vibrating arms generate vibrations including a direction component in the thickness direction (out-of-plane direction), and as a result, there is a problem that the vibration component in the thickness direction leaks to the outside of the vibration element via the base and becomes a noise vibration source to the outside of the vibration element.

SUMMARY

An advantage of some aspects of the invention is to provide a vibration element capable of reducing noise vibration to the outside of the vibration element and a method of manufacturing the vibration element, and also to provide a physical quantity sensor, an inertial measurement device, an electronic apparatus, and a vehicle.

The invention can be implemented as the following application examples or forms.

A vibration element according to an application example includes a base, a vibrating arm which extends from the base and includes an arm positioned on the base side and a weight positioned closer to a tip end side than the arm, a weight film disposed on the weight, and in which the weight has a first principal surface and a second principal surface in a front and back relationship with respect to a thickness direction of the vibration element, a center of gravity of the weight is at a position closer to the first principal surface side than to a center plane of the arm in the thickness direction, and a center of gravity of the weight film is at a position closer to a second principal surface side than to the center plane of the arm in the thickness direction.

According to such a vibration element, since the center of gravity of the weight is at a position on the first principal surface side than to the center plane of the arm in the thickness direction whereas the center of gravity of the weight film is at a position on the second principal surface side than to the center plane of the arm in the thickness direction, the center of gravity of a structure composed of the weight and the weight film can be brought close to the center plane (the center of the vibrating arm in the thickness direction). For that reason, it is possible to reduce unnecessary vibration (vibrations in the thickness direction) of the vibrating arm, and as a result, it is possible to reduce noise vibration to the outside of the vibration element.

In the vibration element according to the application example, it is preferable that the weight includes a first portion and a second portion having a thickness thinner than that of the first portion, and the second principal surface has a stepped shape formed by the first portion and the second portion.

With this configuration, the center of gravity of the weight may be positioned closer to the first principal surface side than to the center plane of the arm in the thickness direction with a relatively simple configuration.

In the vibration element according to the application example, it is preferable that the weight has a portion in which the thickness gradually decreases between the first portion and the second portion in a plan view in the thickness direction of the weight.

With this configuration, the weight film may be formed easily and continuously over the first portion and the second portion. In addition, occurrence of cracks in the weight film due to a step difference between the first portion and the second portion may be reduced.

In the vibration element according to the application example, it is preferable that a width of the weight is larger than a width of the arm in a plan view in the thickness direction.

With this configuration, an area of the weight in which the weight film can be formed may be increased.

In the vibration element according to the application example, it is preferable that the second portion is disposed on both sides in the width direction of the vibrating arm with respect to the first portion.

With this configuration, the torsional moment of the vibrating arm may be reduced.

In the vibration element according to the application example, it is preferable that the second portion is disposed on a side opposite to the base with respect to the first portion.

With this configuration, the area of the second portion in a plan view may be reduced. Further, there is also an advantage that a mass balance in the width direction of the weight is hardly collapsed.

In the vibration element according to the application example, it is preferable that the first portion is provided to surround the second portion in a plan view in the thickness direction of the weight.

With this configuration, designing of the second portion is facilitated.

In the vibration element according to the application example, it is preferable that the first principal surface is a flat surface.

With this configuration, it is not necessary to process the first principal surface side of the weight in order to provide the first portion and the second portion in the weight, and as a result, a manufacturing process of the vibration element may be simplified.

In the vibration element according to the application example, it is preferable that the weight film is disposed on the first portion and the second portion.

With this configuration, it is possible to increase mass of the weight film. In addition, forming of the weight film may be simplified.

In the vibration element according to the application example, it is preferable that the arm has a shape which is plane-symmetric with respect to a center plane in a thickness direction of the arm.

With this configuration, vibration in the thickness direction due to the shape of the vibrating arm may be reduced.

In the vibration element according to the application example, it is preferable that a first vibrating arm which extends from the base and serves as the vibrating arm including a first arm serving as the arm and a first weight serving as the weight, a second vibrating arm which extends from the base and includes a second arm positioned on the base side and a second weight positioned closer to the tip end side than the second arm, a first weight film which serves as the weight film disposed on the first weight, and a second weight film disposed on the second weight are included, and a center of gravity of the second weight is at a position closer to the first principal surface side than to a center plane of the second arm in the thickness direction, and a center of gravity of the second weight film is at a position closer to the second principal surface side than to the center plane of the second arm in the thickness direction.

With this configuration, unnecessary vibration (vibration in the thickness direction) of both the first vibrating arm and the second vibrating arm may be reduced. In addition, since the centers of the first weight and the second weight are both positioned on the first principal surface side (on the same side), and the centers of gravity of the first weight film and the second weight film are both positioned on the second principal surface side (on the same side), it is easy to form the weight and the weight film.

In the vibration element according to the application example, it is preferable that a drive arm that is subjected to drive vibration, and a detection arm which deforms corresponding to an inertial force, are included, and the base includes a base main body and a connector extending from the base main body, the drive arm serves as the vibrating arm and extends from the connector, and the detection arm extends from the base main body.

With this configuration, the characteristics of a so-called double T-type vibration element may be improved.

In the vibration element according to the application example, it is preferable that a drive arm which extends from the base and is subjected to drive vibration, and a detection arm which extends from the base in a direction opposite to the drive arm and deforms corresponding to an inertial force, are included, and the drive arm serves as the vibrating arm.

With this configuration, the characteristics of a so-called H-type vibration element may be improved.

In the vibration element according to the application example, it is preferable that the weight film includes a first weight film and a second weight film having a thickness thinner than the first weight film.

With this configuration, fine adjustment and coarse adjustment may be easily performed when adjusting a resonance frequency of the vibrating arm by removing a part of the weight film by an energy ray such as a laser.

A manufacturing method of a vibration element according to an application example includes forming a base and a vibrating arm which includes a weight and extends from the base, has a first principal surface and a second principal surface which are in a front and back relationship with respect to a thickness direction, and of which a center of gravity is positioned closer to the first principal surface side than to a center plane in the thickness direction, forming a weight film of which a center of gravity is positioned closer to the second principal surface than to the center plane of the vibrating arm in the thickness direction on the vibrating arm, and adjusting a resonance frequency of the vibrating arm by adjusting mass of the weight film.

According to such a manufacturing method of the vibration element, the characteristics of the obtained vibration element may be improved. Since it is sufficient to dispose the weight film only on one surface side of the weight (specifically, on the second principal surface side), it is possible to simplify the manufacturing process of the vibrating element and reduce a splash (dross) generated when the resonance frequency of the vibrating arm is adjusted by removing a part of the weight film by the energy ray such as the laser.

A physical quantity sensor according to an application example includes the vibration element of the application example, and a package which accommodates the vibration element.

According to such a physical quantity sensor, it is possible to improve the sensor characteristics (for example, detection accuracy) of the physical quantity sensor by utilizing the excellent characteristics of the vibration element.

An inertial measurement device according to an application example includes the physical quantity sensor of the application example, and a circuit which is electrically connected to the physical quantity sensor.

According to such an inertial measurement device, it is possible to improve the characteristics (for example, measurement accuracy) of the inertial measurement device by utilizing excellent sensor characteristics of the physical quantity sensor.

An electronic apparatus according to an application example includes the vibration element of this application example.

According to such an electronic apparatus, it is possible to improve characteristics (for example, reliability) of the electronic apparatus by utilizing the excellent characteristics of the vibration device.

A vehicle according to an application example includes the vibration element of this application example.

According to such a vehicle, it is possible to improve the characteristics (for example, reliability) of the vehicle by utilizing excellent characteristics of the vibration element.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, a vibration element, a manufacturing method of the vibration element, a physical quantity sensor, an inertial measurement device, an electronic apparatus, and a vehicle according to the invention will be described in detail based on embodiments illustrated in the accompanying drawings.

1. Vibration Element and Manufacturing Method Thereof

First Embodiment

First, a vibration element and a manufacturing method thereof will be described.

Vibration Element

Figure 1:
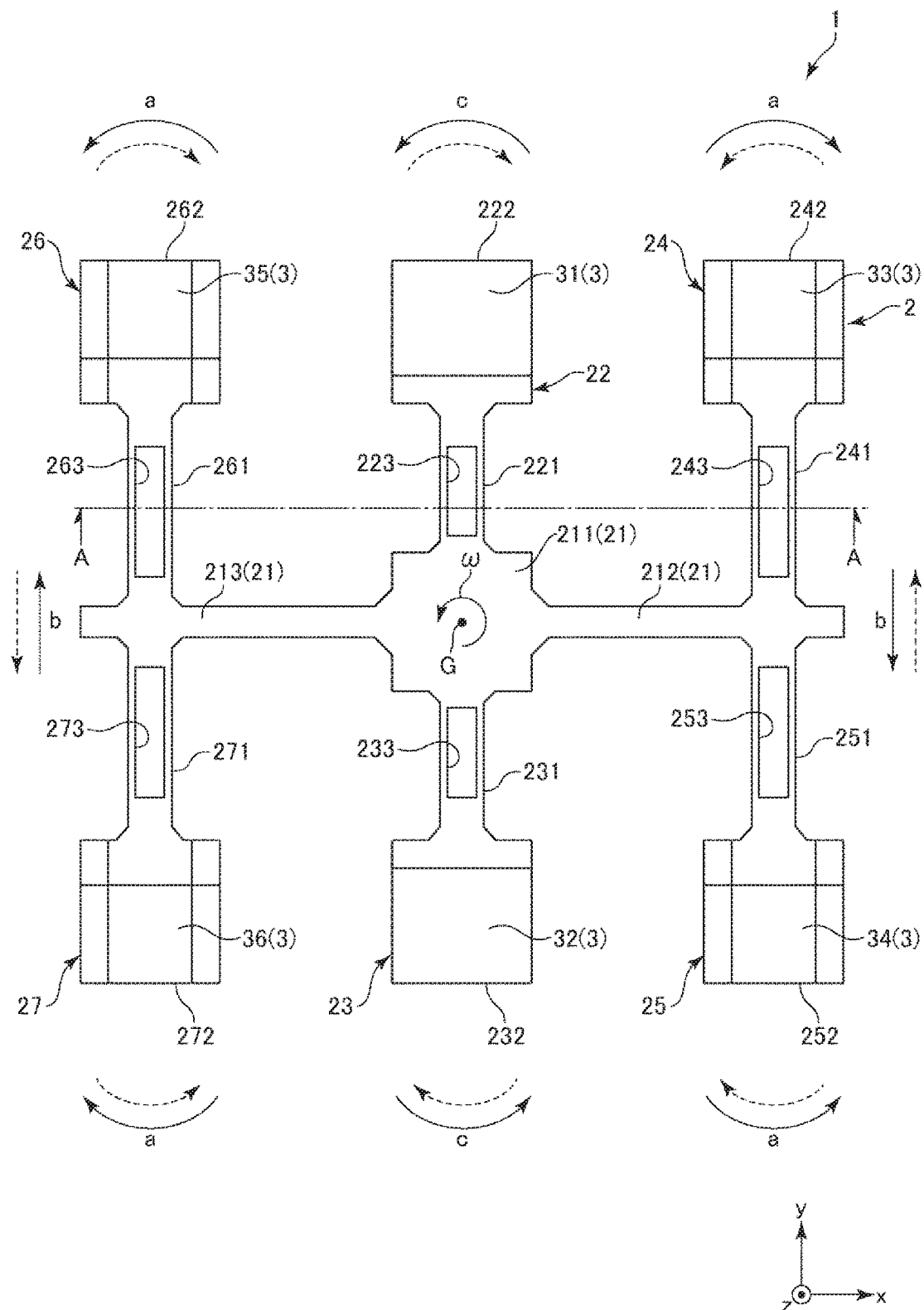
FIG. 1 is a plan view illustrating a vibration element according to a first embodiment of the invention.
Figure 2:
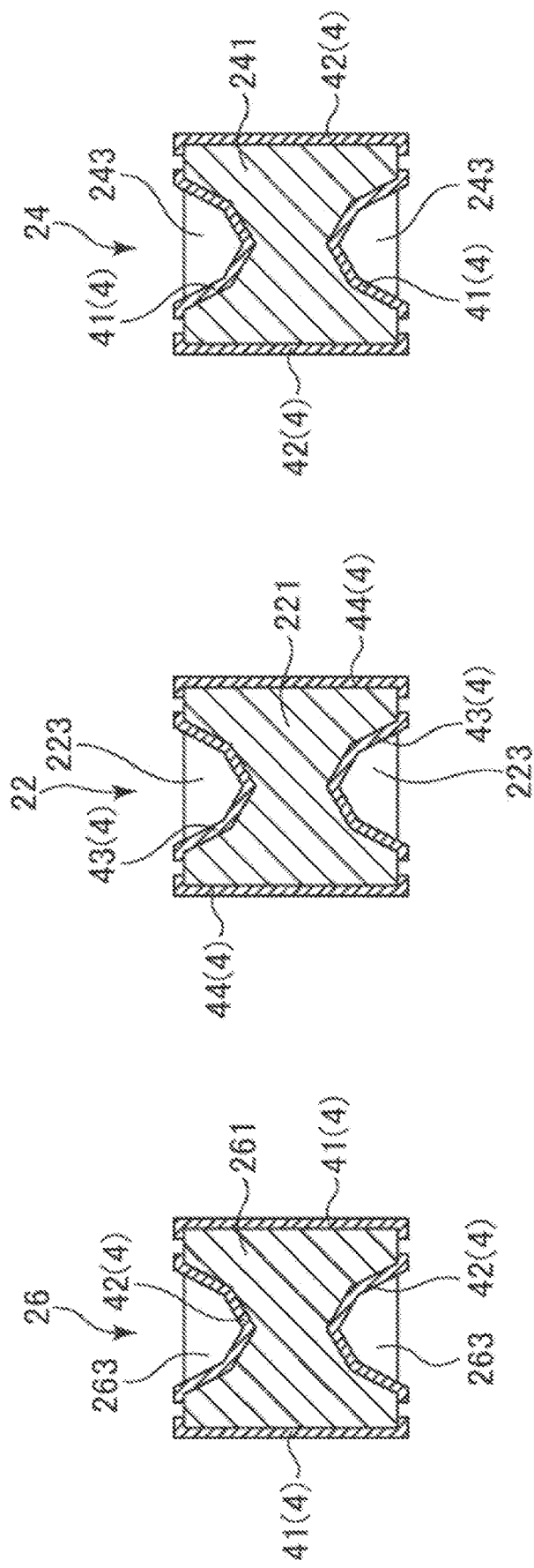
FIG. 2 is a cross-sectional view taken along line A-A in FIG. 1.
Figure 3:
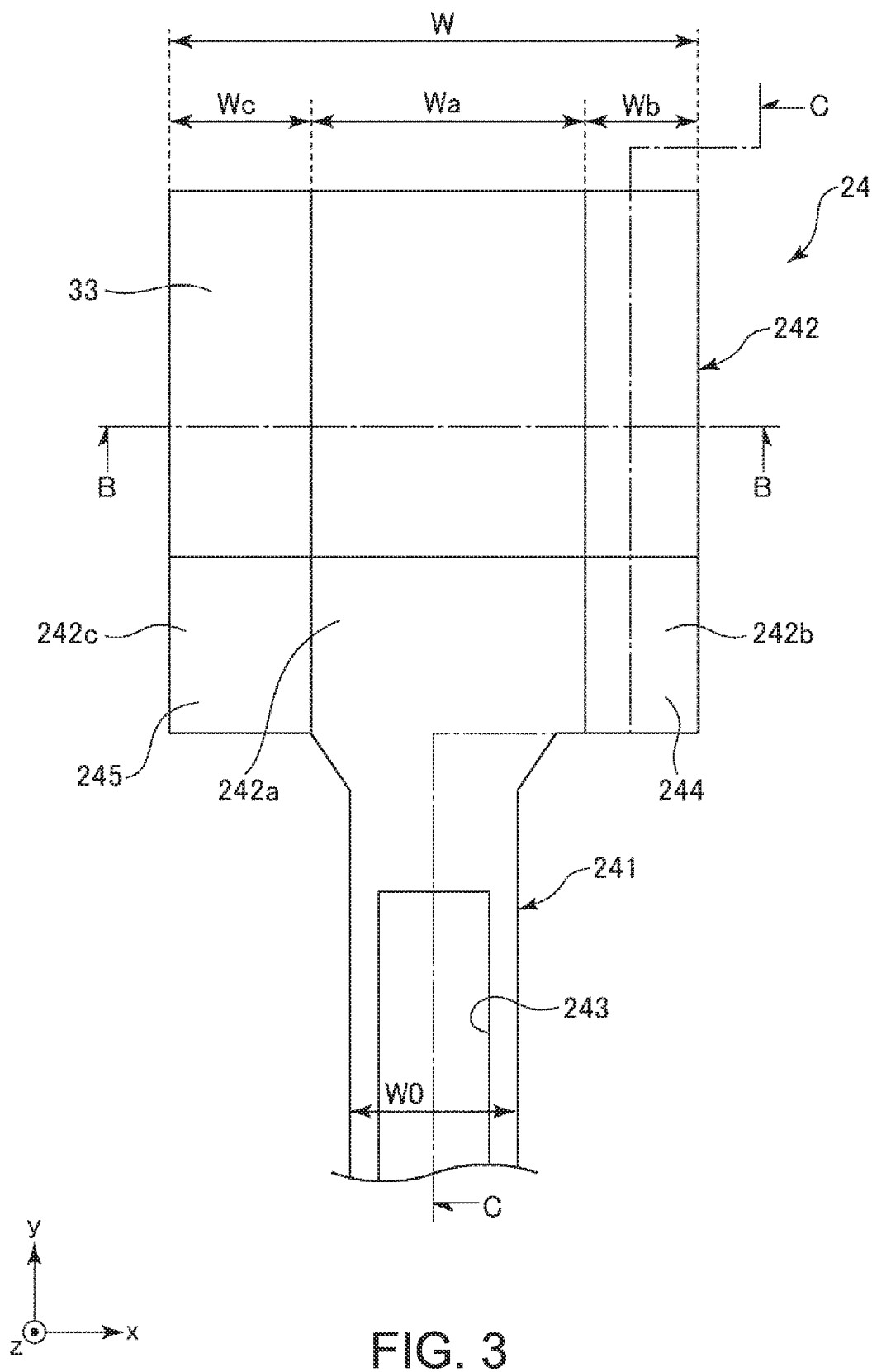
FIG. 3 is an enlarged plan view illustrating a weight and a weight film of a vibrating arm (drive arm) of the vibration element.
Figure 4:
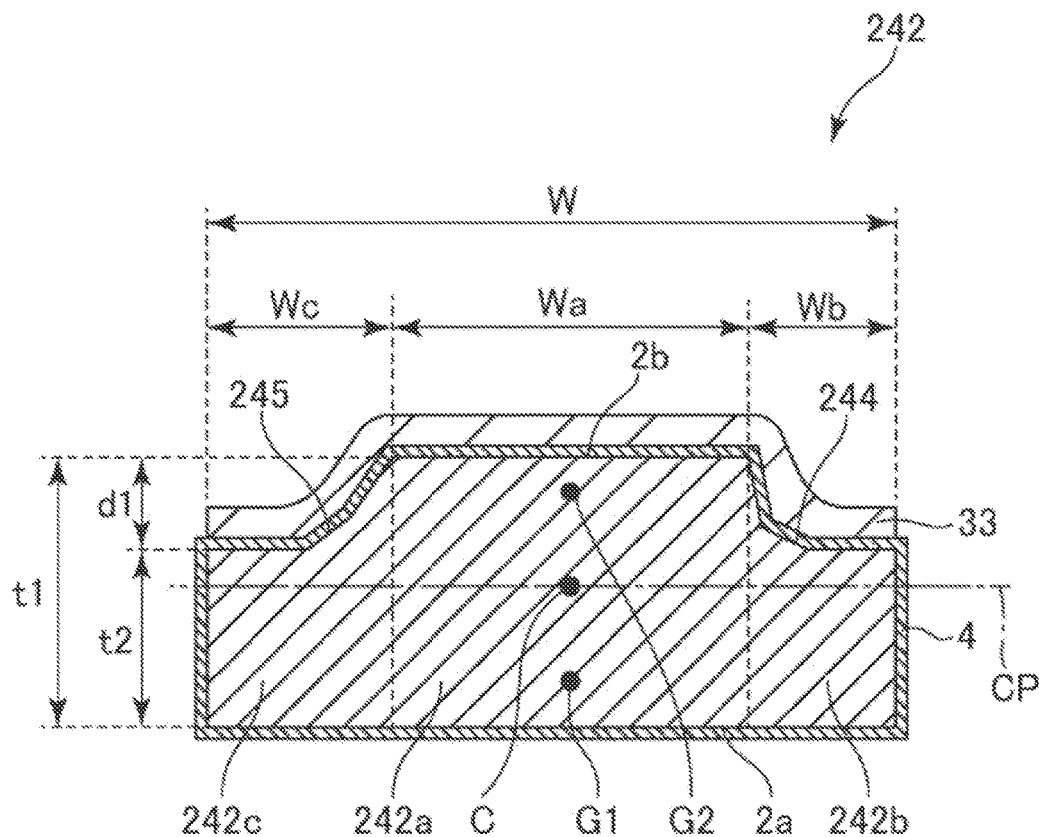
FIG. 4 is a cross-sectional view taken along line B-B in FIG. 3.
Figure 5:
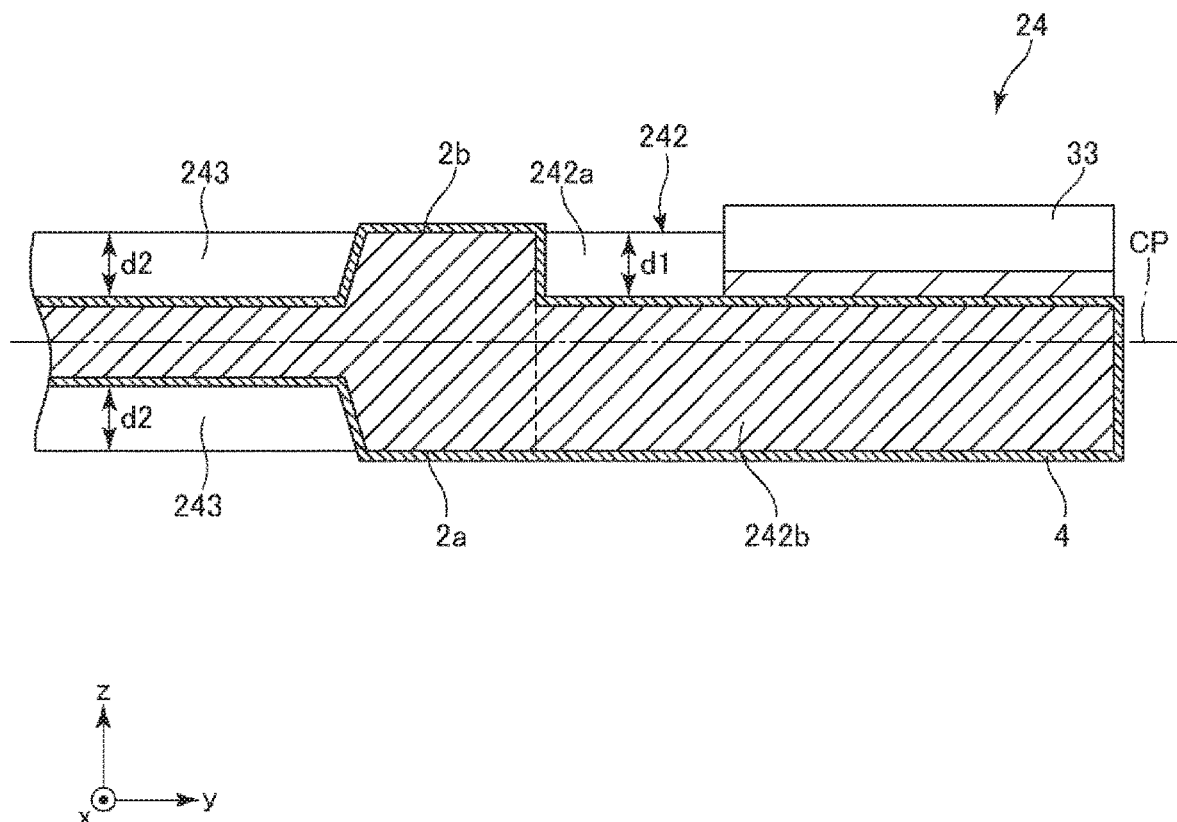
FIG. 5 is a cross-sectional view taken along line C-C in FIG. 3.

FIG. 1 is a plan view illustrating a vibration element according to a first embodiment of the invention. FIG. 2 is a cross-sectional view taken along line A-A in FIG. 1. FIG. 3 is an enlarged plan view illustrating a weight and a weight film of a vibrating arm (drive arm) of the vibration element. FIG. 4 is a cross-sectional view taken along line B-B in FIG. 3. FIG. 5 is a cross-sectional view taken along line C-C in FIG. 3. In each drawing, the dimensions of parts are exaggerated as deemed appropriate, and a dimensional ratio between the parts does not necessarily agree with an actual dimensional ratio. The position, direction, size, and the like of each unit described below also include a range of a manufacturing error and the like (for example, within a range of ±1% or less), and are not limited to the direction, size, and the like described in the specification of the present application, as long as desired functions of each part can be realized.

In the following description, for convenience of explanation, a description will be made by appropriately using three axes of the x-axis, y-axis, and z-axis that are orthogonal to each other. In the following, a direction parallel to the x-axis is referred to as an "x-axis direction", a direction parallel to the y-axis is referred to as a "y-axis direction", and a direction parallel to the z-axis is referred to as a "z-axis direction". The tip end side of an arrow indicating each of the x-axis, y-axis, and z-axis is assumed as "+", and the base end side of the arrow is assumed as "−". Also, the +z-axis direction side is referred to as "upper", the −z-axis direction side is referred to as "lower", the +x-axis direction side is referred to as "right", and the −x-axis direction side is referred to as "left". Also, what is seen from the z-axis direction is referred to as a "plan view". In FIG. 1, for convenience of description, illustration of an electrode film 4 which will be described later is omitted.

A vibration element 1 illustrated in FIG. 1 is a sensor element for detecting an angular velocity around the z-axis. The vibration element 1 includes a vibrator element 2 (see FIG. 1), an electrode film 4 (see FIG. 2) disposed on the vibrator element 2, and a weight film 3 (see FIG. 1) disposed on the electrode film 4.

As illustrated in FIG. 1, the vibrator element 2 has a so-called double T-type structure. More specifically, the vibrator element 2 includes a base 21, a pair of detection arms 22 and 23 (first and second detection arms) extending from the base 21, a pair of drive arms 24 and 25 (first drive arm), and a pair of drive arms 26 and 27 (second drive arm).

Here, the base 21 includes a base main body 211 supported by a package 11 (see FIG. 23) which will be described later, a connecting arm 212 extending from the base main body 211 along the +x-axis direction, and a connecting arm 213 extending from the base main body 211 along the −x-axis direction opposite to the extending direction of the connecting arm 212. The detection arm 22 (first detection arm) extends from the base main body 211 along the +y-axis direction intersecting with the extending direction of the connecting arms 212 and 213, whereas the detection arm 23 (second detection arm) extends from the base main body 211 along the −y-axis direction opposite to the extending direction of the detection arm 22. The drive arm 24 (first drive arm) extends from the tip end region of the connecting arm 212 along the +y-axis direction, whereas the drive arm 25 (first drive arm) extends from the tip end region of the connecting arm 212 along the −y-axis direction opposite to the extending direction of the drive arm 24. Similarly, the drive arm 26 (second drive arm) extends from the tip end region of the connecting arm 213 along the +y-axis direction, whereas the drive arm 27 extends from the tip end region of the connecting arm 213 along the −y-axis direction opposite to the extending direction of the drive arm 26.

The detection arm 22 includes an arm 221 (detection arm link) extending from the base main body 211, a weight 222 (detection weight) provided on the tip end side with respect to the arm 221 and having a width larger than that of the arm 221, and a groove 223 provided in each of the upper and lower surfaces of the arm 221. Similarly, the detection arm 23 includes an arm 231 (detection arm link), a weight 232 (detection weight), and a pair of grooves 233. The drive arm 24 includes an arm 241 (drive arm link) extending from the connecting arm 212, a weight 242 (drive weight) provided on the tip end side with respect to the arm 241 and having a width larger than that of the arm 241, and a pair of grooves 243 provided in the upper and lower surfaces of the arm 241. Similarly, the drive arm 25 includes an arm 251 (drive arm link), a weight 252 (drive weight), and a pair of grooves 253. The drive arm 26 includes an arm 261 (drive arm link) extending from the connecting arm 213, a weight 262 (drive weight) provided on the tip end side with respect to the arm 261 and having a width larger than that of the arm 261, and a pair of grooves 263 provided in the upper and lower surfaces of the arm 261. Similarly, the drive arm 27 includes an arm 271 (drive arm link), a weight 272 (drive weight), and a pair of grooves 273.

At least one of the upper and lower grooves may be omitted in each of the pairs of grooves 223, 233, 243, 253, 263, and 273. Further, one pair of upper and lower grooves may be in communication with each other in each of the grooves 223, 233, 243, 253, 263, and 273. That is, the arms 221, 231, 241, 251, 261, and 271 may be provided with through holes (slots) which open on the upper and lower surfaces. The width of the weights 222, 232, 242, 252, 262, and 272 may be equal to or less than the width of the arms 221, 231, 241, 251, 261, and 271.

Here, the arm 221 is a portion that is bent (deformed) when the detection arm 22 vibrates (during detection vibration), and is a portion (portion where the detection signal electrode 43 and the detection ground electrode 44, which will be described later, are provided) that detects electric charges generated by detection vibration of the detection arm 22. Similarly, the arm 231 is a portion that bends (deforms) when the detection arm 23 vibrates (during detection vibration), and is a portion (portion where the detection signal electrode 43 and the detection ground electrode 44, which will be described later, are provided) that detects electric charges generated by detection vibration of the detection arm 23. The arm 241 is a portion that is bent (deformed) when the drive arm 24 vibrates (during drive vibration), and is a portion (portion where the drive signal electrode 41 and the drive ground electrode 42, which will be described later, are provided) to which an electric field for driving the drive arm 24 is applied. Similarly, the arms 251, 261 and 271 are portions that are bent (deformed) when the drive arms 25, 26 and 27 vibrate (during drive vibration), respectively, and are portions (portions where the drive signal electrode 41 and the drive ground electrode 42, which will be described later, are provided) to which an electric field for driving the e drive arms 25, 26 and 27. Further, the weight 222 is a portion on the tip end side of the arm 221. Similarly, the weights 232, 242, 252, 262, and 272 are portions on the tip end sides of the arms 231, 241, 251, 261, and 271, respectively.

As illustrated in FIG. 3, the weight 242 includes a first portion (centroid) 242a on an extension line of the arm 241 and a pair of second portions (flanks) 242b and 242c on both sides in the width direction of the first portion 242a. As illustrated in FIG. 4, a thickness t2 of each of second portions 242b and 242c is thinner than a thickness t1 of the first portion 242a. Here, a first principal surface 2a is flat (planar), whereas a second principal surface 2b is provided with steps 244 and 245 by the first portion 242a and the second portions 242b and 242c. The steps 244 and 245 are configured to include inclined surfaces (chamfered), and the thickness of the weight 242 gradually increases (inwardly) from the second portions 242b and 242c side toward the first portion 242a side. The second portions 242b and 242c as described above can be formed by etching (anisotropic etching) the second principal surface 2b of the weight 242 as described later.

As illustrated in FIG. 4, the center of gravity G1 of such a weight 242 is positioned closer to the first principal surface 2a side of the first principal surface 2a (lower surface) and the second principal surface 2b (upper surface) of the weight 242 that are in a front and back relationship with respect to the center C of the drive arm 24 in the thickness direction. That is, the centers of gravity G1 of the weights 242, 252, 262, and 272 are (offset towards) at positions on the first principal surface 2a side than to a center plane CP of the arms 241, 251, 261, and 271, in the thickness direction whereas the centers of gravity G2 of the weight films 33, 34, 35, and 36 are (offset towards) at positions on the second principal surface 2b side than to the center plane CP of the arms 241, 251, 261, and 271 in the thickness direction. By shifting the center of gravity G1 in the thickness direction with respect to the center C in this manner, it is possible to balance with the weight film 33 having the center of gravity G2 positioned on the side opposite to the center of gravity G1 of the weight 242 as described later. Similarly to the weight 242, the centers of gravity G1 of the weights 252, 262, and 272 are positioned closer to on the first principal surface 2a side of the first principal surface 2a (lower surface) and the second principal surface 2b (upper surface) that are in a front and back relationship of the weights 252 of each of the weights 252, 262, and 272 than the center C of the drive arms 25, 26, and 27 in the thickness direction. Also, the centers of gravity of the weights 222 and 232 may also be positioned closer to on the first principal surface side of the first principal surface (lower surface) and the second principal surface (upper surface) that are in the front and back relationship of each of the weights 222 and 232 with respect to each of the centers of the detection arms 22 and 23 in the thickness direction.

Here, "the central plane CP of the arm 241" in the thickness direction refers to a plane which is orthogonal to the thickness direction (z-axis direction) of the arm 241 and in which the distance between the outermost portion in the thickness direction on the first principal surface 2a side of the arm 241 and the outermost portion in the thickness direction on the second principal surface 2b side is equal. The center plane of the arms 251, 261, and 271 in the thickness direction is also defined in the same manner as the center plane CP of the arm 241 in the thickness direction. "The weight film 33" refers to a laminate (on the drive arm 24) having a larger mass per unit area than the electrode film 4 (drive signal electrode 41 and drive ground electrode 42) of the arm 241. The weight films 34, 35, and 36 are also defined in the same manner as the weight film 33, respectively.

The depth d1 of the steps 244 and 245 of the second principal surface 2b, that is, the difference between the thickness t1 of the first portion 242a and the thickness t2 of the second portions 242b and 242c is not particularly limited but is preferably equal to the depth d2 of the groove 243 (see FIG. 5). With this configuration, the steps 244 and 245 described above can be collectively formed with the grooves 243 by etching. The depth d1 of the step is preferably 0.1 times or more and 0.5 times or less, more preferably 0.15 times or more and 0.4 times or less with respect to the thickness t1 of the weight 242.

The widths Wb and Wc of the second portions 242b and 242c may be equal to or different from each other, but it is preferable that the width Wc of the second portion 242c (inboard flank) is larger than the width Wb of the second portion 242b (outboard flank). In a case where the vibrator element 2 is formed by anisotropic etching of the Z-cut quartz crystal plate, due to its anisotropy, an average thickness of the second portion 242b becomes thicker than the average thickness of the second portion 242c. For that reason, the mass of the second portion 242b and the mass of the second portion 242c can be equalized by making the width Wc of the second portion 242c larger than the width Wb of the second portion 242b.

The widths Wb and Wc of the specific second portions 242b and 242c are determined according to the thickness, the area, and the like of the weight film 33 to be described later, respectively, and are not particularly limited, but the widths Wb and We are about 0.3 times to 0.8 times the width Wa of the first portion 242a. The area of each of the second portions 242b and 242c in a plan view is not particularly limited, but is, for example, about 0.1 times to 2 times the area of the first portion 242a in a plan view.

The vibrator element 2 is configured by a Z-cut quartz crystal plate. By configuring the vibrator element 2 with a quartz crystal (Z-cut quartz crystal plate), it is possible to improve the vibration characteristics (especially, frequency-temperature characteristics) of the vibrator element 2. Further, the vibrator element 2 can be formed with high dimensional accuracy by etching. The quartz crystal belongs to a trigonal system and has the X-axis, Y-axis, and Z-axis orthogonal to each other as a crystal axis. The X-axis, the Y-axis, and the Z-axis are referred to as an electric axis, a mechanical axis, and an optical axis, respectively. The Z-cut quartz crystal plate is a plate-like quartz crystal substrate having a spread in the XY-plane defined by the Y-axis (mechanical axis) and the X-axis (electric axis) and having a thickness in the Z-axis (optical axis) direction. Here, the X-axis of the quartz crystal configuring the vibrator element 2 is parallel to the x-axis, the Y-axis is parallel to the y-axis, and the Z-axis is parallel to the z-axis.

In addition, the vibrator element 2 may be made of a piezoelectric material other than quartz crystal. Examples of the piezoelectric material other than quartz crystal include lithium tantalate, lithium niobate, lithium borate, barium titanate, and the like. Depending on the configuration of the vibrator element 2, the vibrator element 2 may be configured by of a quartz crystal plate having a cut angle other than the Z-cut. Further, the vibrator element 2 may be made of a material (a material not having piezoelectricity) other than the piezoelectric material, for example, silicon, and in this case, a piezoelectric element (element having a structure in which a piezoelectric film made of PZT or the like is sandwiched between a pair of electrodes) may be disposed on each of the arms of the detection arms 22 and 23 and the drive arms 24, 25, 26, and 27.

The electrode film 4 is provided on the surface of the vibrator element 2 configured as described above. As illustrated in FIG. 2, the electrode film 4 includes drive signal electrodes 41, drive ground electrodes 42, detection signal electrodes 43, detection ground electrodes 44, and a plurality of terminals (not illustrated) electrically connected to these electrodes.

The drive signal electrodes 41 are electrodes for exciting drive vibration of the drive arms 24, 25, 26, and 27. As illustrated in FIG. 2, the drive signal electrodes 41 are provided on the upper and lower surfaces of the arm 241 of the drive arm 24 and are provided on both side surfaces of the arm 261 of the drive arm 26, respectively. Similarly, although not illustrated, the drive signal electrodes 41 are provided on the upper and lower surfaces of the arm 251 of the drive arm 25 and are provided on both side surfaces of the arm 271 of the drive arm 27, respectively.

On the other hand, each of the drive ground electrodes 42 has a reference potential (for example, ground potential) with respect to each of the drive signal electrodes 41. As illustrated in FIG. 2, the drive ground electrodes 42 are provided on both side surfaces of the arm 241 of the drive arm 24 and are provided on upper and lower surfaces of the arm 261 of the drive arm 26, respectively. Similarly, although not illustrated, the drive ground electrodes 42 are provided on both side surfaces of the arm 251 of the drive arm 25 and are provided on upper and lower surfaces of the arm 271 of the drive arm 27, respectively.

The detection signal electrodes 43 are electrodes for detecting the electrical charge generated by detection vibration of the detection arm 22 when the detection vibration is excited. As illustrated in FIG. 2, the detection signal electrodes 43 are provided on the upper and lower surfaces of the arm 221 of the detection arm 22, respectively.

On the other hand, each of the detection ground electrodes 44 has a reference potential (ground potential, for example) with respect to each of the detection signal electrodes 43. As illustrated in FIG. 2, the detection ground electrodes 44 are provided on both side surfaces of the arm 221 of the detection arm 22.

Although not illustrated, the detection signal electrodes for detecting the electric charge of the detection arm 23 generated by the detection vibration of the detection arm 23 when the detection vibration of the detection arm 23 is excited are provided on the upper and lower surfaces of the arm 231 of the detection arm 23. Similarly, each of the detection ground electrodes of the detection arm 23 has a potential (for example, ground potential) serving as a reference with respect to each of the detection signal electrodes of the detection arm 23, and are provided on both side surfaces of the arm 231 of the detection arm 23. Vibration detection may be performed by a differential signal between the detection signal electrodes 43 of the detection arm 22 and the detection signal electrodes of the detection arm 23.

As the constituent materials of the electrode film 4, although not particularly limited, metallic materials, for example, gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), zirconium (Zr), or a transparent electrode material such as ITO or ZnO can be used. Among the materials, it is preferable to use a metal (gold, gold alloy) or platinum mainly composed of gold. A layer of Ti, Cr, or the like may be provided as an underlayer having a function of preventing the electrode film 4 from peeling from the vibrator element 2 between the electrode film 4 and the vibrator element 2.

The electrode film 4 has portions disposed on the weights 222, 232, 242, 252, 262, and 272 of the vibrator element 2 described above. The weight film 3 is disposed on the weights 222, 232, 242, 252, 262, and 272 via the portions, respectively. The electrode films 4 may not be disposed directly under the weight film 3.

As illustrated in FIG. 1, the weight film 3 has a weight film 31 disposed on the weight 222, a weight film 32 disposed on the weight 232, a weight film 33 disposed on the weight 242, a weight film 34 disposed on the weight 252, a weight film 35 disposed on the weight 262, and a weight film 36 disposed on the weight 272. The weight films 31 and 32 are films which can be used for adjusting the resonance frequency of the detection arms 22 and 23 by being removed by an appropriate amount by the energy ray such as a laser. Further, the weight films 33, 34, 35, and 36 are films which can be used for adjusting the resonance frequency of the drive arms 24, 25, 26, and 27 by being removed by an appropriate amount by the energy ray such as a laser.

The weight film 33 is disposed on the second principal surface 2b (of the first principal surface 2a (lower surface) and the second principal surface 2b (upper surface) that are in the front and back relationship of the weight 242), and is not disposed on the first principal surface 2a. The weight film 33 is also not disposed on the side surfaces (right and left side surfaces and front end surface) of the weight 242. In the present embodiment, the weight film 33 is provided over the entire region in the width direction (x-axis direction) of the weight 242 but is excluded from a part on the base end side of the weight 242. Accordingly, the weight film 33 is disposed over the first portion 242a and the second portions 242b and 242c of the weight 242.

As illustrated in FIG. 4, the center of gravity G2 of such a weight film 33 is positioned closer to the second principal surface 2b side (of the first principal surface 2a (lower surface) and the second principal surface 2b (upper surface) that are in the front and back relationship of the weight 242) with respect to the center C of the drive arm 24 in the thickness direction. By shifting the center of gravity G2 in the thickness direction with respect to the center C in this manner, it is possible to balance with the weight 242 having the center of gravity G1 positioned on the side opposite to the center of gravity G2 of the weight film 33 as described later. Similarly to the weight film 33, each of the centers of gravity of the weight films 34, 35, and 36 is positioned closer to the second principal surface 2b side (of the first principal surface 2a (lower surface) and the second principal surface 2b (upper surface) that are in the front and back relationship) of each of the weights 252, 262, and 272 with respect to the center C of each of the drive arms 25, 26, and 27 in the thickness direction. In addition, the centers of gravity of the weight films 31 and 32 are respectively positioned closer to the second principal surface side (of the first principal surface (lower surface) and the second principal surface (upper surface) that are in a front and back relationship) of each of the weights 222 and 232 with respect to the center of each of the detection arms 22 and 23 in the thickness direction.

The position, size, range, and the like of the weight films 31 to 36 are not limited to the positions, sizes, ranges, and the like illustrated in the drawings. For example, the weight film 3 may be disposed on the first principal surface 2a and side surfaces of each of the weights 222, 232, 242, 252, 262, and 272. In this case, with respect to the weight films 33, 34, 35, and 36 excluding the weight films 31, 32, the thickness, the disposition, and the like may be adjusted so that the centers of gravity G2 of the weight films are positioned on the second principal surface 2b side. Further, the weight film 3 may be provided over the entire region in the length direction (y-axis direction) of the weights 222, 232, 242, 252, 262, and 272.

The constituent material of the weight film 3 is not particularly limited, and, for example, metal, an inorganic compound, resin, or the like can be used, but it is preferable to use metal or an inorganic compound. Films of metal or the inorganic compound can be formed easily and highly accurately by a vapor phase film disposition method. The weight films 31 to 36 made of metal or inorganic compound can be efficiently and highly accurately removed by irradiation with energy beams. From the matters described above, the frequency adjustment described later becomes more efficient and highly accurate by forming the weight film 3 with a metal or an inorganic compound.

Examples of such metals include nickel (Ni), gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), zirconium (Zr), and the like, and one kind or a combination of two or more kinds of the metals can be used. Among these metals, Al, Cr, Fe, Ni, Cu, Ag, Au, Pt or an alloy containing at least one of these metals can be used as the metal from the viewpoint that the weight film 3 can be formed using the same material as the electrode film 4. More specifically, it is preferable that the weight film 3 has a structure in which an upper layer made of Au (gold) is laminated on an underlayer made of, for example, Cr (chromium). With this configuration, adhesion to the vibrator element 2 or the electrode film 4 formed by using quartz crystal is excellent, and adjustment of the resonance frequency can be performed with high accuracy and efficiency.

Examples of such inorganic compounds include oxide ceramics such as alumina (aluminum oxide), silica (silicon oxide), titania (titanium oxide), zirconia, yttria, and calcium phosphate, nitride ceramics such as silicon nitride, aluminum nitride, titanium nitride, and boron nitride, carbide-based ceramics such as graphite and tungsten carbide, and in addition, ferroelectric materials such as barium titanate, strontium titanate, PZT, PLZT, PLLZT, and the like. Among the materials, it is preferable to use an insulating material such as silicon oxide ($SiO_2$), titanium oxide ($TiO_2$), and aluminum oxide ($Al_2O_3$).

The thickness (average thickness) of the weight film 3 is not particularly limited but is, for example, about 10 nm or more and 10000 nm or less.

The vibration element 1 configured as described above detects an angular velocity ω around the z-axis as follows. First, by applying a voltage (drive signal) between the drive signal electrode 41 and the drive ground electrode 42, the drive arm 24 and the drive arm 26 subjected to flexural vibration (drive vibration) so that the drive arm 24 and the drive arm 26 repeat approaching and separating from each other in the direction indicated by the arrow a in FIG. 1 and the drive arm 25 and the drive arm 27 are subjected to flexural vibration (drive vibration) so that the drive arm 25 and the drive arm 27 repeat approaching and separating from each other in the same direction as the flexural vibration. At this time, if an angular velocity is not applied to the vibration element 1, the drive arms 24 and 25 and the drive arms 26 and 27 is subjected to plane-symmetric vibration with respect to the yz-plane passing through the center point (center of gravity G) and thus, the base main body 211, the connecting arms 212 and 213, and the detection arms 22 and 23 hardly vibrate. At this time, as described above, since the centers of gravity G1 of the weights 242, 252, 262, and 272 and the centers of gravity G2 of the weight films 33, 34, 35, and 36 are positioned on opposite sides with respect to the center C of the drive arms 24, 25, 26, and 27, vibration the drive arms 24, 25, 26, and 27 in the out-of-plane direction of can be reduced.

When the angular velocity ω around the normal line passing through the center of gravity G of the vibration element 1 (that is, around the z-axis) is applied to the vibration element 1 in a state (drive mode) where the drive arms 24 to 27 are subjected to drive vibration, a Coriolis force acts on each of the drive arms 24 to 27. With this configuration, the connecting arms 212 and 213 are subjected to flexural vibration in the direction indicated by the arrow b in FIG. 1, and along with this, the flexural vibration (detection vibration) of the detection arms 22 and 23 in the direction indicated by the arrow c in FIG. 1 is excited so as to cancel this flexural vibration. Electric charges are generated between the detection signal electrodes 43 and the detection ground electrodes 44 according to the detection vibration (detection mode) of the detection arms 22 and 23. Based on such electric charges, the angular velocity ω applied to the vibration element 1 can be obtained.

As described above, the vibration element 1 includes the base 21, the drive arms 24, 25, 26, and 27 which are vibrating arms that extend from the base 21, have the arms 241, 251, 261, and 271 positioned closer to the base 21 side and the weights 242, 252, 262, and 272 are at positions more on the tip end side than the arms 241, 251, 261, and 271, and the weight films 33, 34, 35, and 36 disposed on the weights 242, 252, 262, and 272. Here, each of the weights 242, 252, 262, and 272 has the first principal surface 2a and the second principal surface 2b which are in a front and back relationship. The centers of gravity G1 of the weights 242, 252, 262, and 272 are at positions more on the first principal surface 2a side relative to the center plane CP (plane passing through the center C of the drive arms 24, 25, 26, and 27 in the thickness direction and orthogonal to the z-axis) of the arms 241, 251, 261, and 271 in the thickness direction. In contrast, the centers of gravity G2 of the weight films 33, 34, 35, and 36 are at positions more on the second principal surface 2b side relative to the center plane CP of the arms 241, 251, 261, and 271 in the thickness direction.

According to such a vibration element 1, the centers of gravity G1 of the weights 242, 252, 262, and 272 are at positions more on the first principal surface 2a side than the central surface CP of the arms 241, 251, 261, and 271 in the thickness direction, whereas the centers of gravity G2 of the weight films 33, 34, 35, and 36 are at positions more on the second principal surface 2b side than the central surface CP of the arms 241, 251, 261, and 271 in the thickness direction. Thus, the center of gravity of the entire structure composed of the weights 242, 252, 262, and 272 and the weight films 33, 34, 35, and 36 can be brought close to the center plane CP (center C of the drive arms 24, 25, 26, and 27). For that reason, it is possible to reduce unnecessary vibrations (vibration in the thickness direction) of the drive arms 24, 25, 26, and 27, and as a result, it is possible to reduce noise vibration to the outside of the vibration element 1. Although a manufacturing method will be described later, since it is sufficient to dispose the weight films 33, 34, 35, and 36 only on one side (specifically, on the second principal surface 2b side) of the weights 242, 252, 262, and 272, the manufacturing process of the vibration element 1 can be simplified, a part of the weight films 33, 34, 35, and 36 can be removed by an energy ray such as a laser, and a splash (dross) generated when adjusting the resonance frequency of the vibrating arm can be reduced.

The center of gravity G1 of each of the weights 242, 252, 262, and 272 is positioned on the first principal surface 2a side (on the same side) and the center of gravity G2 of each of the weight films 33, 34, 35, 36 is positioned on the second principal surface 2b side (on the same side), and it is easy to form the weights 242, 252, 262, and 272 and the weight films 33, 34, 35, and 36. One of the drive arms 24, 25, 26, and 27 corresponds to a "first vibrating arm", and another one corresponds to a "second vibrating arm". The first vibrating arm includes one of the arms 241, 251, 261, and 271 as a first arm and includes a weight, which is connected to the first arm, of the weights 242, 252, 262, and 272 as a first weight. The second vibrating arm includes a weight different from the first weight of the arms 241, 251, 261, and 271 as a second arm, and includes a weight, which is connected to the second arm, of the weights 242, 252, 262, and 272 as a second weight. One of the weight films 33, 34, 35, and 36 as the first weight film is disposed on the first weight, and one of the weight films 33, 34, 35, and 36 as the second weight film is disposed on the second weight.

Here, it is preferable that each of the arms 241, 251, 261, and 271 has a shape that is plane-symmetric with respect to the center plane CP in the thickness direction. With this configuration, it is possible to reduce vibration in the thickness direction due to the shape of the drive arms 24, 25, 26, and 27.

The vibration element 1 of this embodiment includes drive arms 24, 25, 26, and 27 that are subjected to drive vibration and the detection arms 22 and 23 that deform in accordance with an inertial force, and the base 21 includes the base main body 211 and the connecting arms 212 and 213 which are connectors extending from the base main body 211. The drive arms 24, 25, 26, and 27 are vibrating arms and extend from the connecting arms 212 and 213, and the detection arms 22 and 23 extend from the base main body 211. With this configuration, the characteristics of a so-called double T-type vibration element 1 can be improved.

The width W of each of the weights 242, 252, 262, and 272 is larger than the width WO of each of the arms 241, 251, 261, and 271 in a plan view from the thickness direction of the weight 242. With this configuration, it is possible to increase each of the areas of the weights 242, 252, 262, and 272 in which the weight films 33, 34, 35, and 36 can be respectively formed. Further, the lengths of the drive arms 24, 25, 26, and 27 can be shortened, and as a result, miniaturization of the vibration element 1 can be achieved.

The weight 242 has the first portion 242a and the second portions 242b and 242c that are thinner than that of the first portion 242a. The second principal surface 2b has the stepped steps 244 and 245 by the first portion 242a and the second portions 242b and 242c. With this configuration, it is possible to position the center of gravity G1 of the weight 242 closer to the first principal surface 2a side than to the center plane CP of the arm 241 in the thickness direction with a relatively simple configuration. The weights 252, 262, and 272 are also configured in the same manner as the weight 242, and exhibit the same effect. Here, the "step 244" has a shape in which the average distance from the center plane to the second principal surface 2b of the weight 242 in the first portion 242a in the thickness direction is larger than the average distance from the center plane to the second principal surface 2b of the weight 242 in the second portion 242b in the thickness direction. "The center plane of the weight 242" in the thickness direction refers to a plane which is orthogonal to the thickness direction of the weight 242 and in which the distance between the outermost portion in the thickness direction on the first principal surface 2a side of the weight 242 and the outermost portion in the thickness direction on the second principal surface 2b side of the weight 242 are equal. The thickness direction of the weight 242 and the thickness direction of the arm 241 are the same. In the drawing, the center plane of the weight 242 in the thickness direction and the center plane CP of the arm 241 in the thickness direction are on the same plane. The step 245 is also defined in the same manner as the step 244.

The steps 244 and 245 provided on the second principal surface 2b described above contain inclined surfaces, and the weight 242 has a portion where the thickness gradually decreases between the first portion 242a and the second portions 242b and 242c in a plan view from the thickness direction of the weight 242. With this configuration, the weight film 33 can be easily formed continuously over the first portion 242a and the second portions 242b and 242c. It is possible to reduce the occurrence of cracks in the weight film 33 due to the steps 244 and 245 between the first portion 242a and the second portions 242b and 242c. The weights 252, 262, and 272 are also configured in the same manner as the weight 242, and exhibit the same effect.

In this embodiment, the second portions 242b and 242c are disposed on both sides in the width direction of the drive arm 24 (vibrating arm) with respect to the first portion 242a. With this configuration, it is possible to reduce the mass of both end portions in the width direction of the weight 242 and to reduce a torsional moment of the drive arm 24. The weights 252, 262, and 272 are also configured in the same manner as the weight 242, and exhibit the same effect.

The first principal surface 2a of the weight 242 is a flat surface. With this configuration, it is not necessary to process the first principal surface 2a side of the weight 242 in order to provide the first portion 242a and the second portions 242b and 242c in the weight 242, and as a result, the manufacturing process of the vibration element 1 can be simplified. The weights 252, 262, and 272 are also configured in the same manner as the weight 242, and exhibit the same effect. Although the first principal surface 2a may have a step like the second principal surface 2b, since the position of the center of gravity G1 is set as described above, it is preferable that the depth of the step of the first principal surface 2a is shallower than the depth of the step of the second principal surface 2b.

The weight film 33 is disposed on the first portion 242a and the second portions 242b and 242c. With this configuration, the mass of the weight film 33 can be increased. Further, forming of the weight film 33 can be simplified. The weight films 34, 35, and 36 are also configured in the same manner as the weight film 33, and exhibit the same effect. The weight film 33 may be provided on only one of the first portion 242a and the second portions 242b and 242c as long as the center of gravity G2 is positioned as described above. Here, in the case where the weight film 33 is provided only on the first portion 242a, there is an advantage that mass balance in the width direction of the drive arm 24 can be easily obtained as compared with the case where the weight film 33 is provided only on the second portions 242b and 242c.

In addition, although the thickness of the weight film 33 is uniform in the drawing, the weight film 33 may have a plurality of portions having different thicknesses from each other. That is, the weight film 33 may include a first weight film and a second weight film having a thickness thinner than that of the first weight film. In this case, it is possible to easily perform fine adjustment and coarse adjustment when adjusting the resonance frequency of the drive arm 24 by removing a part of the weight film 33 with an energy ray such as a laser. Here, the first weight film having a thick thickness has large mass per unit area and is suitable for coarse adjustment (rough adjustment) of the resonance frequency of the drive arm 24. On the other hand, the second weight film having a small thickness has small mass per unit area and is suitable for fine adjustment (minute adjustment) of the resonance frequency of the drive arm 24. Further, the weight films 34, 35, and 36 also exhibit the same effect by being configured in the same manner as the weight film 33.

In this embodiment, although description is made on a case where with respect to the drive arms 24, 25, 26, and 27, the center of gravity of the entire structure composed of the weights 242, 252, 262, and 272 and the weight films 33, 34, 35, and 36 is brought close to the center C of each of the drive arms 24, 25, 26, and 27, the detection arms 22 and 23 may also be configured similarly to the drive arms 24, 25, 26, and 27. In this case, the center plane of the arms 221 and 231 in the thickness direction is defined in the same manner as the center plane of the arm 241 in the thickness direction. The weight films 31 and 32 are defined in the same manner as the weight film 33, respectively.

Manufacturing Method of Vibration Element

In the following, a manufacturing method of the vibration element according to the invention will be described by taking a case of manufacturing the vibration element 1 described above as an example.

Figure 6:
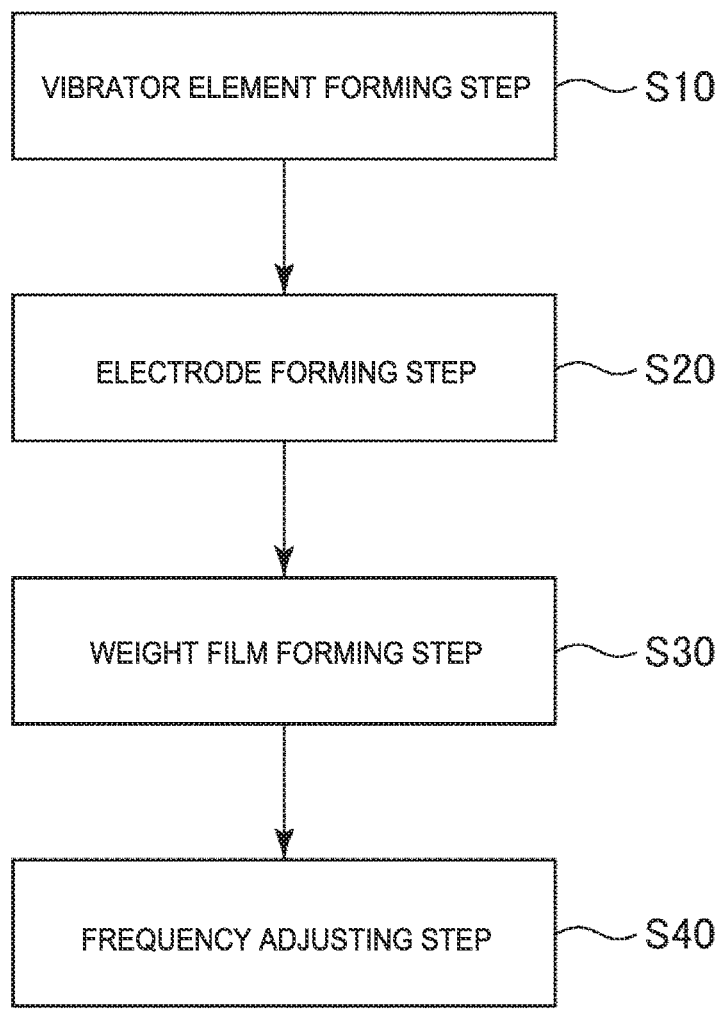
FIG. 6 is a flowchart illustrating an example of a manufacturing method of the vibration element.

FIG. 6 is a flowchart illustrating an example of a manufacturing method of the vibration element. As illustrated in FIG. 6, the manufacturing method of the vibration element 1 includes a vibrator element forming step S10, an electrode forming step S20, a weight film forming step S30, and a frequency adjusting step S40. Each step will be described in sequence below.

Vibrator Element Forming Step S10

Figure 7:
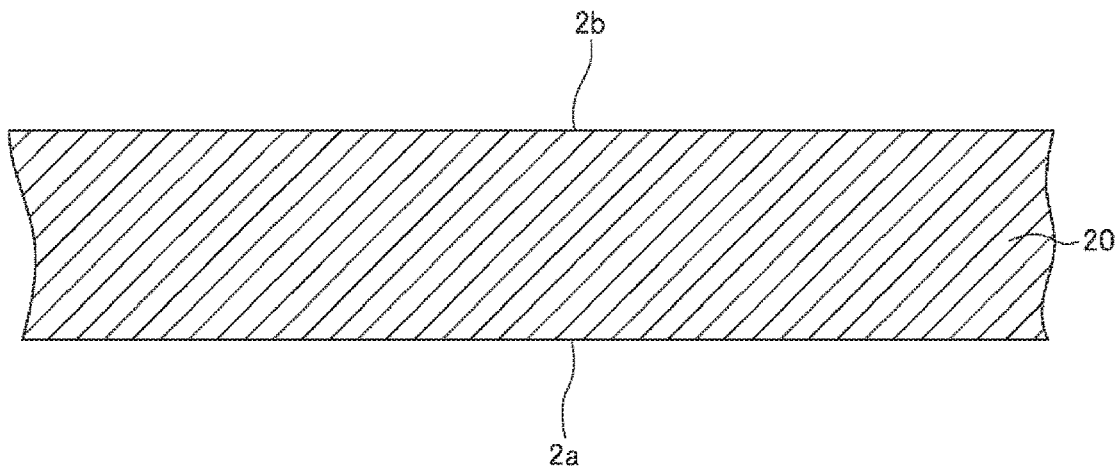
FIG. 7 is a cross-sectional view illustrating a sub-step of preparing a substrate in a vibrator element forming step.
Figure 8:
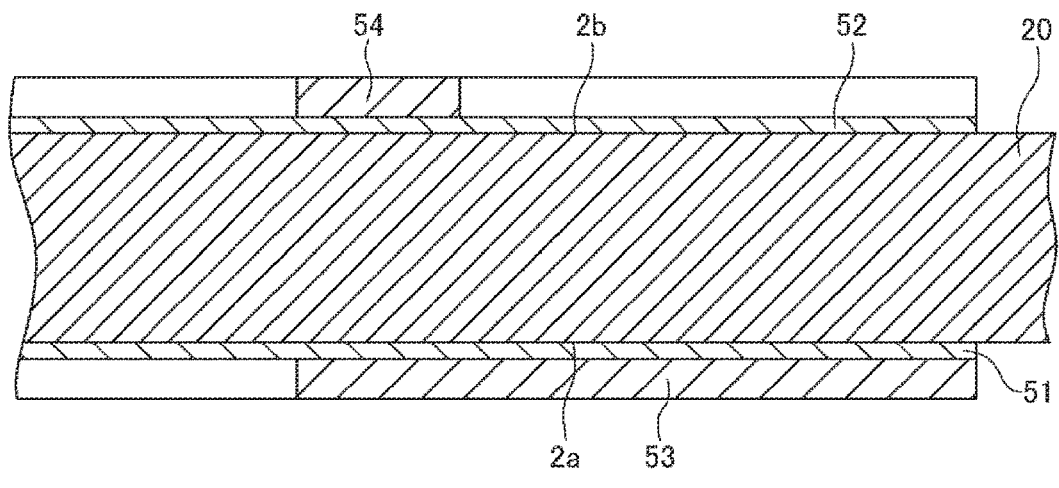
FIG. 8 is a cross-sectional view illustrating a sub-step of forming a corrosion-resistant film and a resist film in the vibrator element forming step.
Figure 9:
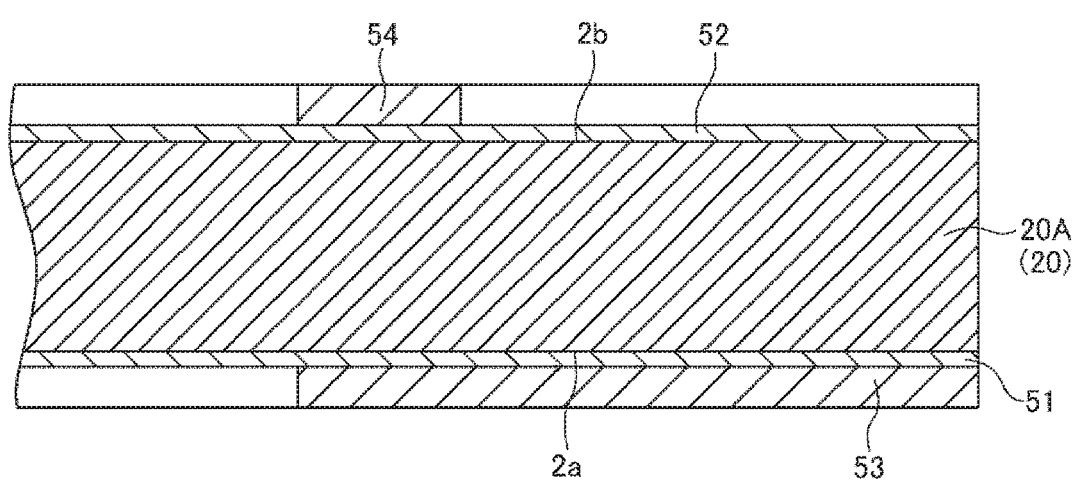
FIG. 9 is a cross-sectional view illustrating a sub-step of forming an outer shape of the vibrator element in the vibrator element forming step.
Figure 10:
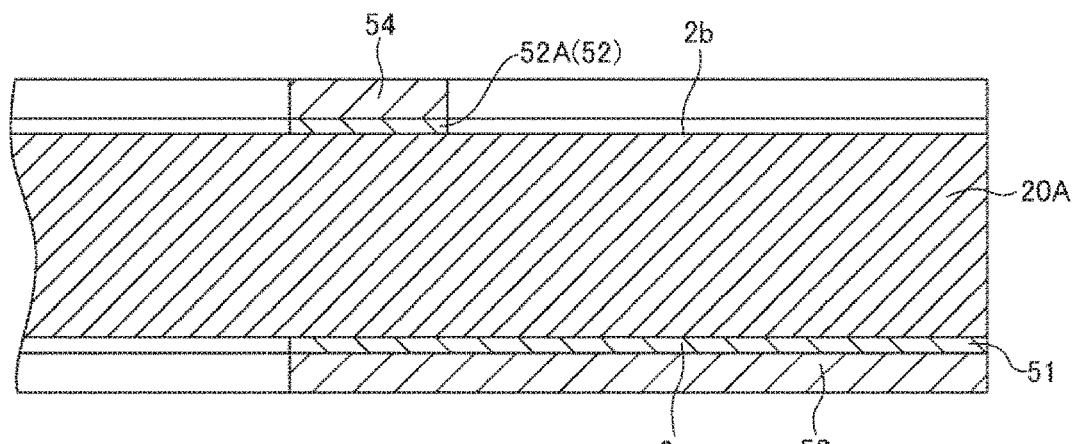
FIG. 10 is a cross-sectional view illustrating a sub-step of removing a part of the corrosion-resistant film in the vibrator element forming step.
Figure 11:
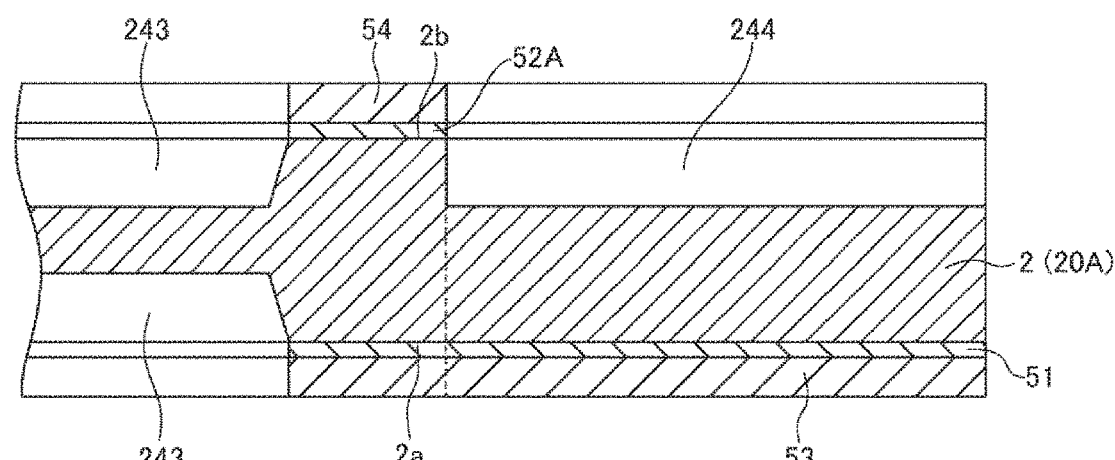
FIG. 11 is a cross-sectional view illustrating a sub-step of forming a groove portion in the vibrator element forming step.
Figure 12:
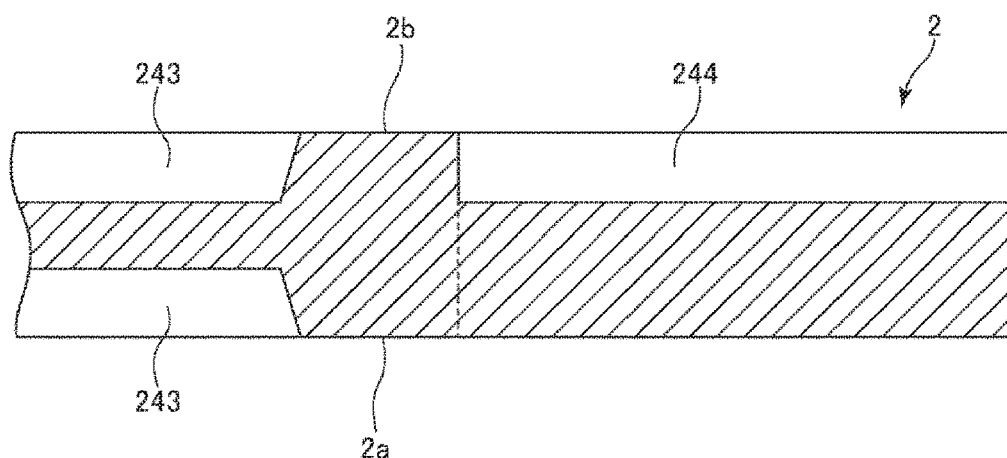
FIG. 12 is a cross-sectional view illustrating a sub-step of removing the corrosion-resistant film and the resist film in the vibrator element forming step.

FIG. 7 is a cross-sectional view illustrating a sub-step of preparing a substrate in a vibrator element forming step. FIG. 8 is a cross-sectional view illustrating a sub-step of forming a corrosion-resistant film and a resist film in the vibrator element forming step. FIG. 9 is a cross-sectional view illustrating a sub-step of forming an outer shape of the vibrator element in the vibrator element forming step. FIG. 10 is a cross-sectional view illustrating a sub-step of removing a part of the corrosion-resistant film in the vibrator element forming step. FIG. 11 is a cross-sectional view illustrating a sub-step of forming a groove portion in the vibrator element forming step. FIG. 12 is a cross-sectional view illustrating a sub-step of removing the corrosion-resistant film and the resist film in the vibrator element forming step. FIGS. 7 to 12 illustrate cross-sections corresponding to FIG. 5.

First, the vibrator element 2 is formed. Specifically, for example, first, as illustrated in FIG. 7, a quartz crystal substrate 20 having the first principal surface 2a and the second principal surface 2b is prepared. Then, as illustrated in FIG. 8, corrosion-resistant films 51 and 52 and resist films 53 and 54 are sequentially formed on both surfaces of the quartz crystal substrate 20. Here, each of the corrosion-resistant films 51 and 52 is a laminated film in which, for example, chromium and gold are laminated in this order by vapor deposition method, sputtering method, or the like, has resistance to an etching solution used for the sub-step of forming the outer shape and the sub-step of forming the groove which will be described later, and is patterned according to a shape (outer shape) of the vibrator element 2 in a plan view. Each of the resist films 53 and 54 is a film made of a resist material, has resistance to an etching solution used for the sub-step of forming the outer shape and the sub-step of forming the groove which will be described later, and is patterned by being subjected to exposure and development according to the shape in a plan view of the groove 243, the second portions 242b and 242c and the like as well as the shape in a plan view (external shape) of the vibrator element 2.

Next, as illustrated in FIG. 9, the quartz crystal substrate 20 is etched using the corrosion-resistant films 51 and 52 and the resistant films 53 and 54 as a mask to obtain a quartz crystal substrate 20A having the same outer shape as the vibrator element 2 (outer shape forming sub-step). Thereafter, as illustrated in FIG. 10, the corrosion-resistant film 52 is etched by using the resist film 54 as a mask to obtain a corrosion-resistant film 52A. As illustrated in FIG. 11, the quartz crystal substrate 20A is etched using the corrosion-resistant films 51 and 52A and the resist films 53 and 54 as a mask, and as illustrated in FIG. 12, the corrosion-resistant films 51 and 52A and the resist films 53 and 54 are removed by etching or the like to obtain the vibrator element 2 (groove forming sub-step).

Here, the vibrator element 2 may be in a state (hereinafter, also referred to as "wafer state") of being connected to another part of the quartz crystal substrate 20A. In this wafer state, for example, the vibrator element 2 is connected to the other part of the quartz crystal substrate 20A through a folding portion of which at least one of the width and thickness is small and weakly formed. Further, in the wafer state, it is possible to collectively form a plurality of vibration elements 1 on the quartz crystal substrate 20A.

Electrode Forming Step S20

Figure 13:
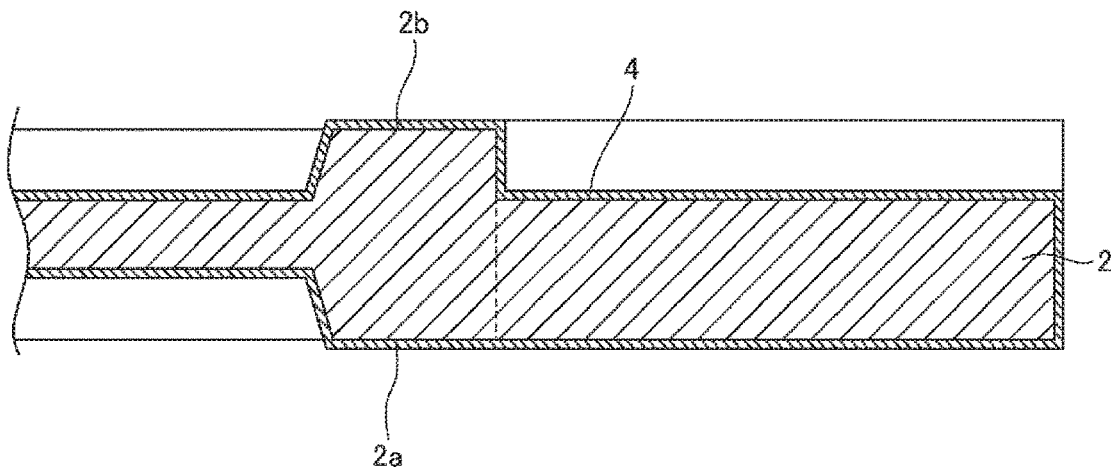
FIG. 13 is a cross-sectional view illustrating an electrode forming step.

FIG. 13 is a cross-sectional view illustrating an electrode forming step.

As illustrated in FIG. 13, the electrode film 4 is formed. More specifically, a metal film is uniformly formed on the surface of the vibrator element 2, for example, by sputtering or the like. Then, a photoresist is applied, exposed, and developed to obtain a resist mask, and then the metal film in the part exposed from the resist mask is removed using an etching solution. With this configuration, the electrode film 4 is formed.

Weight Film Forming Step S30

Figure 14:
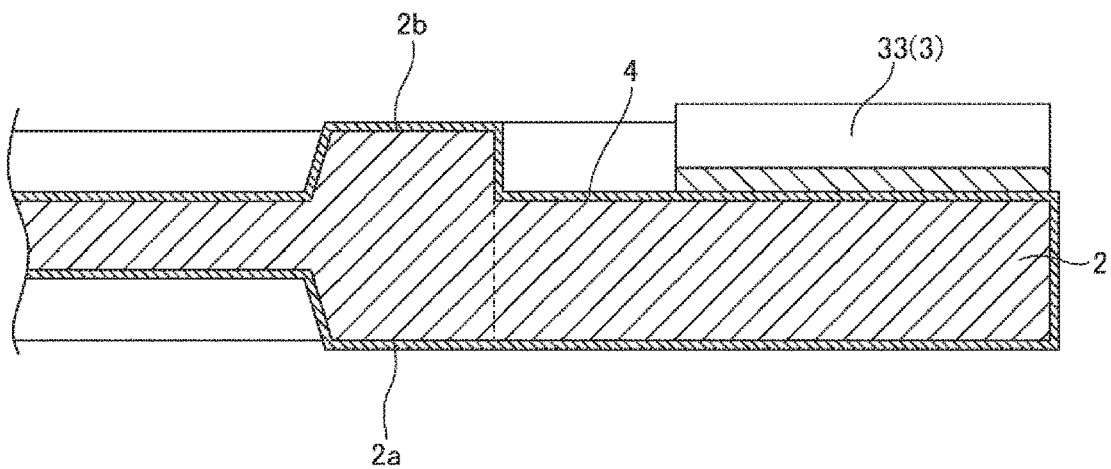
FIG. 14 is a cross-sectional view illustrating a weight film forming step.

FIG. 14 is a cross-sectional view illustrating a weight film forming step.

As illustrated in FIG. 14, the weight film 3 is formed by mask evaporation or the like.

Frequency Adjusting Step S40

Figure 15:
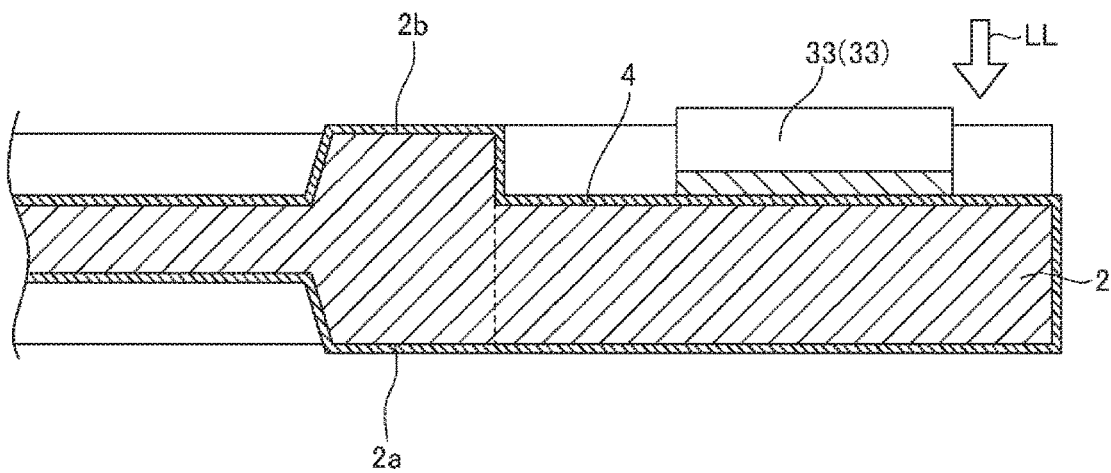
FIG. 15 is a cross-sectional view illustrating a frequency adjusting step.

FIG. 15 is a cross-sectional view illustrating a frequency adjusting step.

As illustrated in FIG. 15, a part of the weight film 3 is removed by the energy ray LL as desired. More specifically, as desired, a part of the weight films 33 to 36 is removed so that the resonance frequencies of the drive arms 24 to 27 are equal to each other, and the frequencies (resonance frequencies of the drive arms 24 to 27) of drive vibrations are adjusted. Further, as desired, a part of the weight films 31 and 32 is removed, and the frequencies (resonance frequency of the detection arms 22 and 23) of detection vibrations are adjusted.

As the energy ray LL, for example, a pulsed laser such as YAG, YVO$_4$, excimer laser or the like, a continuous oscillation laser such as a carbon dioxide gas laser, focused ion beam (FIB), ion beam figuring (IBF), or the like can be used.

Such a frequency adjusting step S40 may be performed in the wafer state or in a state of being mounted on a package 11 which will be described later. Further, the frequency adjusting step S40 may be performed in a plurality of times. For example, coarse adjustment may be performed as a first adjustment in a wafer state and fine adjustment may be performed as a second adjustment in a state of being mounted on the package 11.

As described above, the manufacturing method of the vibration element 1 includes the step (vibrator element forming step S10) of forming the drive arm 24 (vibrating arm) which extends from the base 21, has the base 21, the first principal surface 2a and the second principal surface 2b which are in a front and back relationship with respect to the thickness direction of the vibration element 1, and of which the center of gravity G1 is positioned closer to the first principal surface 2a side than to the center plane in the thickness direction, the step (weight film forming step S30) of forming the weight film 33 on the drive arm 24, of which the center of gravity G2 is positioned closer to the second principal surface 2b side than to the center plane of the drive arm in the thickness direction, and a step (frequency adjusting step S40) of adjusting the resonance frequency of the drive arm 24 by adjusting the mass of the weight film 33. According to such a manufacturing method of the vibration element 1, the characteristics of the obtained vibration element 1 can be improved. "The center plane of the drive arm 24" in the thickness direction refers to a plane which is orthogonal to the thickness direction of the drive arm 24 and in which the distance between the outermost portion in the thickness direction on the first principal surface 2a side of the drive arm 24 and the outermost portion in the thickness direction on the second principal surface 2b side of the drive arm 24 are equal. In this embodiment, although description is made by taking the case where the frequency is adjusted by reducing the mass of the weight film 33 by removing a part of the weight film 33 by the energy ray LL as an example, the frequency may be adjusted by increasing the mass of the weight film 33 by forming a film on the weight film 33 by a film formation method such as sputtering. The same applies to the resonance frequencies of the other drive arms 25 to 27 and the detection arms 22 and 23.

Second Embodiment

Figure 16:
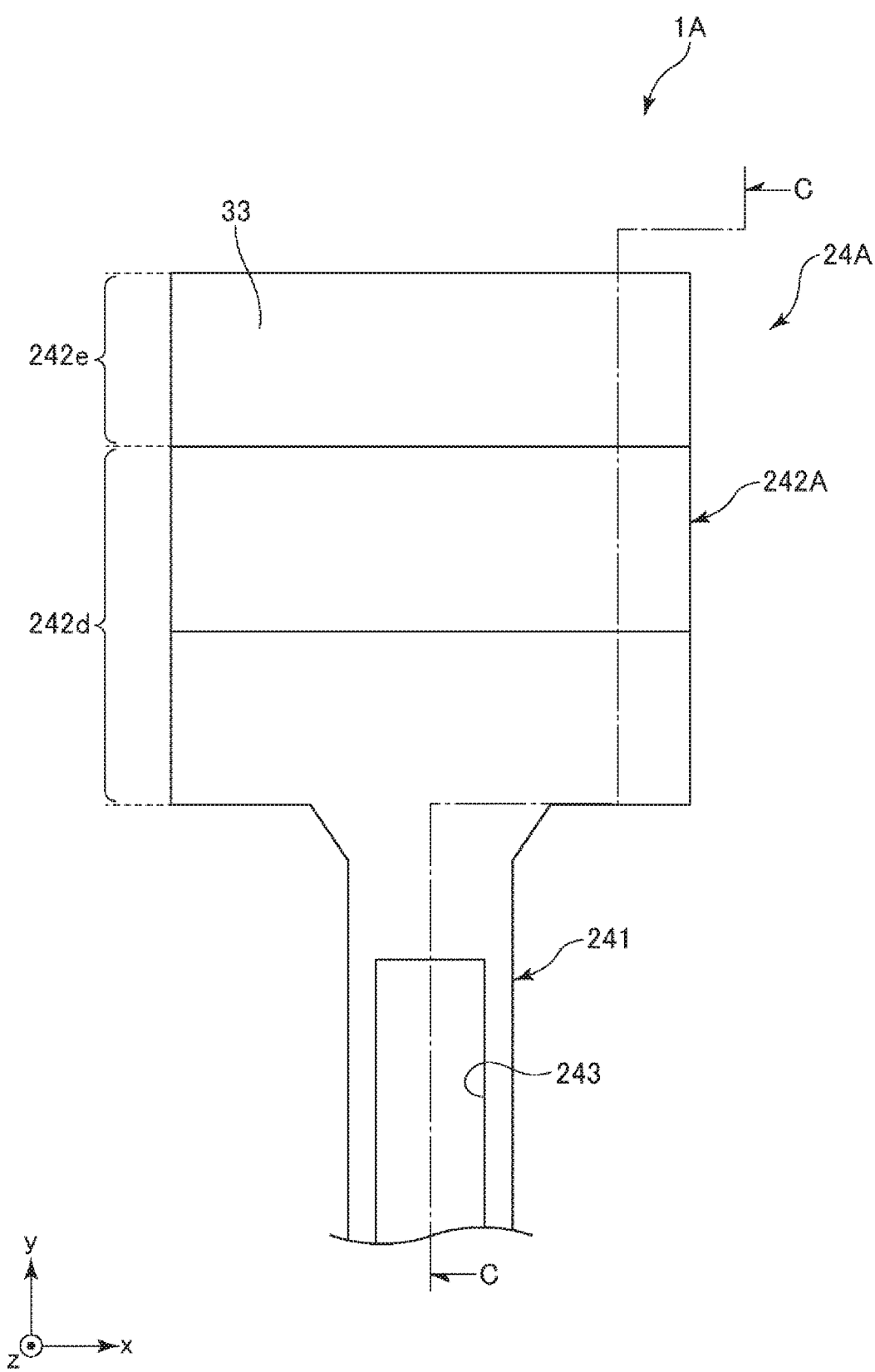
FIG. 16 is an enlarged plan view illustrating a weight and a weight film of a vibrating arm (drive arm) of a vibration element according to a second embodiment of the invention.
Figure 17:
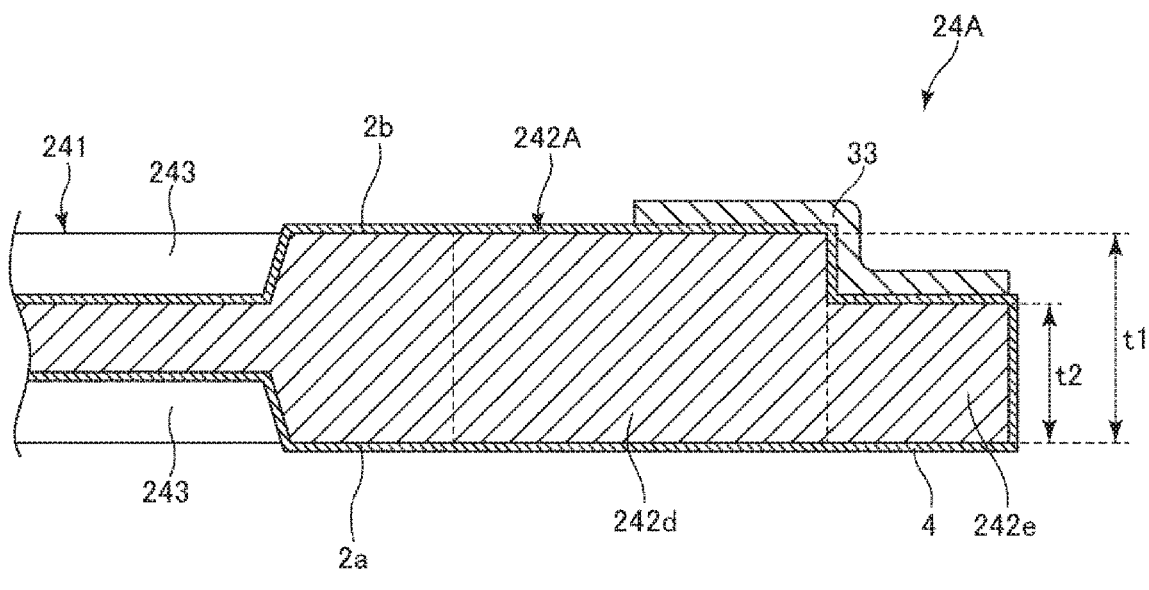
FIG. 17 is a cross-sectional view taken along line C-C in FIG. 16.

FIG. 16 is an enlarged plan view illustrating a weight and a weight film of a vibrating arm (drive arm) of a vibration element according to a second embodiment of the invention. FIG. 17 is a cross-sectional view taken along line C-C in FIG. 16.

In the following, the second embodiment will be described, but the differences from the embodiment described above will be mainly described, and description of similar matters will be omitted. In FIG. 16 and FIG. 17, the same reference numerals are given to the same components as in the embodiment described above. In the following description, one drive arm will be representatively described, but the same applies to the other drive arms.

This embodiment is the same as the first embodiment described above except that the configuration (shape) of the weight is different.

As illustrated in FIG. 16, a weight 242A of a drive arm 24A of a vibration element 1A according to this embodiment includes a first portion 242d connected to the arm 241 and a second portion 242e disposed on the side opposite to the arm 241 with respect to the first portion 242d. As illustrated in FIG. 17, the thickness t2 of the second portion 242e is thinner than the thickness t1 of the first portion 242d. Here, the weight film 33 is disposed over the first portion 242d and the second portion 242e.

According to this embodiment as described above, similarly as in the first embodiment, the vibrating characteristics can be improved.

In this embodiment, the second portion 242e is disposed on the side opposite to the base 21 with respect to the first portion 242d. With this configuration, since the second portion 242e is positioned at the tip end portion of the drive arm 24A having a large mass effect, the area of the second portion 242e in a plan view can be reduced. Further, there is also an advantage that weight balance of the weight 242A in the width direction is difficult to collapse.

Third Embodiment

Figure 18:
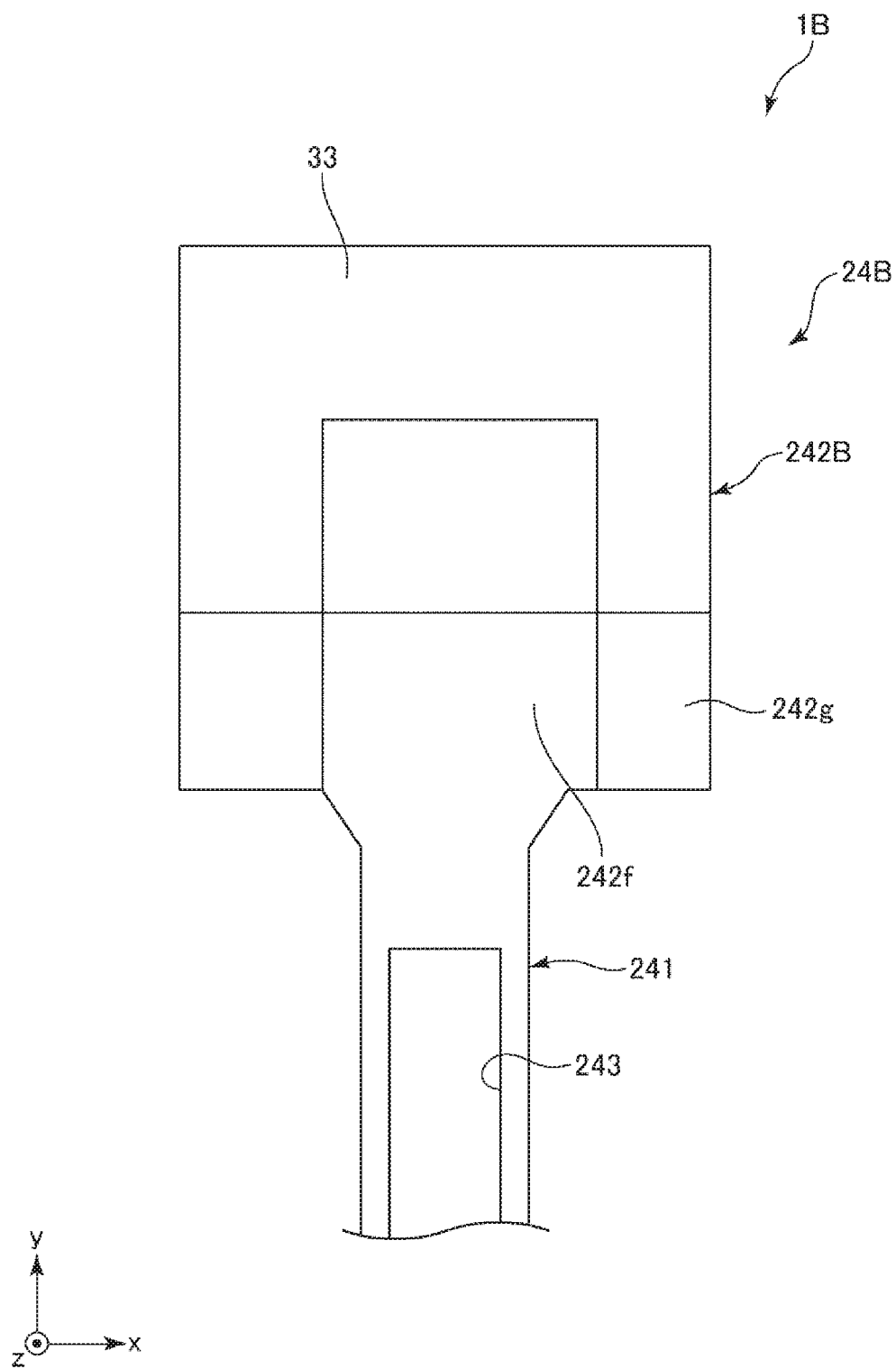
FIG. 18 is an enlarged plan view illustrating a weight and a weight film of a vibrating arm (drive arm) of a vibration element according to a third embodiment of the invention.

FIG. 18 is an enlarged plan view illustrating a weight and a weight film of a vibrating arm (drive arm) of a vibration element according to the third embodiment of the invention.

Hereinafter, a third embodiment will be described, but differences from the embodiments described above will be mainly described, and description of similar matters will be omitted. In FIG. 18, the same reference numerals are given to the same configurations as those in the embodiment described above. In the following description, one drive arm will be representatively described, but the same applies to the other drive arms.

This embodiment is the same as the first embodiment described above except that the configuration (shape) of the weight is different.

A weight 242B of a drive arm 24B of a vibration element 1B of this embodiment is formed by combining the first embodiment and the second embodiment described above. That is, as illustrated in FIG. 18, the weight 242B includes a first portion 242f connected to the arm 241 and a second portion 242g on both sides and the tip side in the width direction of the first portion 242f. The thickness of the second portion 242g is thinner than the thickness of the first portion 242f. Here, the weight film 33 is disposed over the first portion 242f and the second portion 242g.

According to this embodiment as described above, similarly as in the first embodiment, the vibrating characteristics can be improved.

Fourth Embodiment

Figure 19:
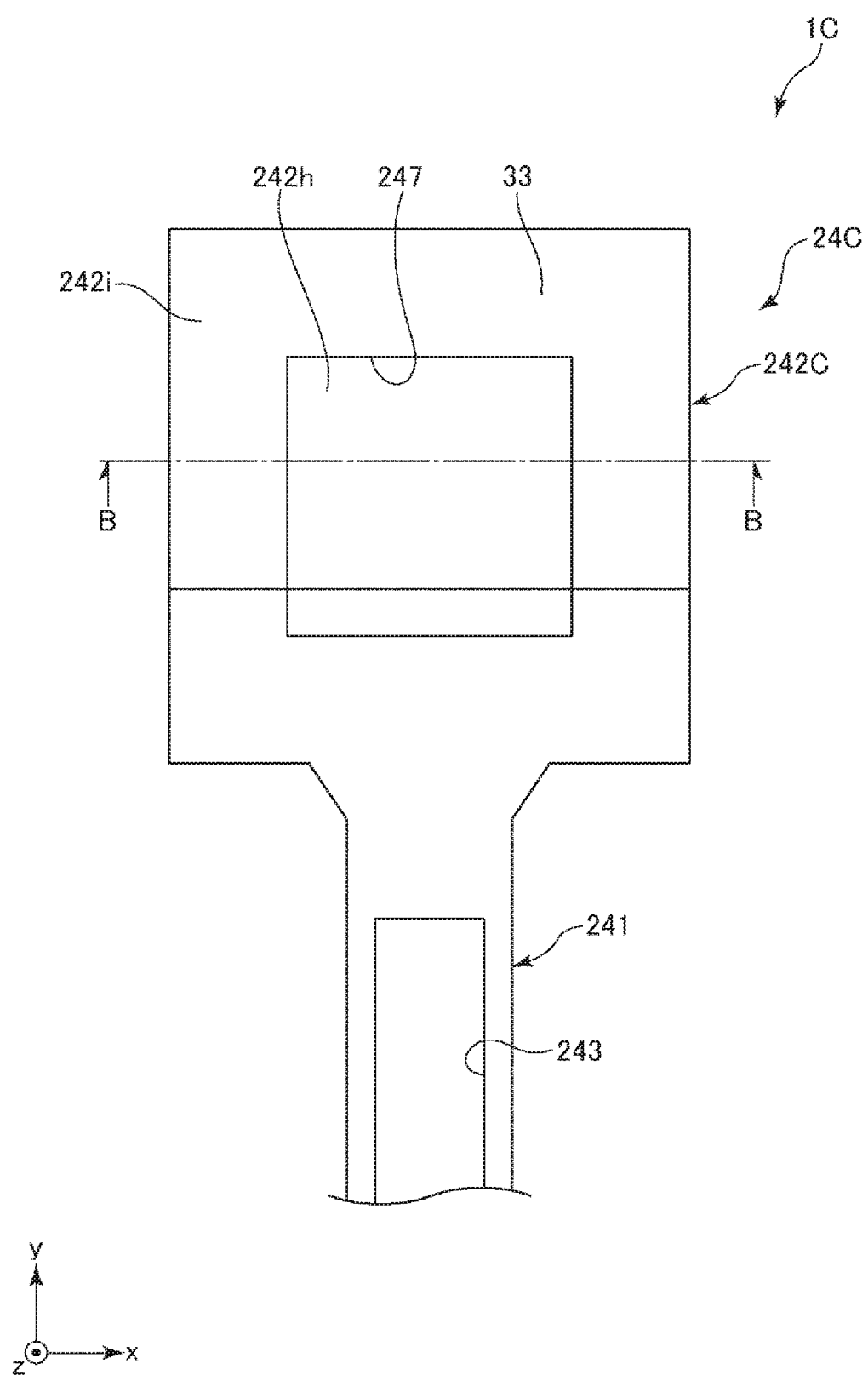
FIG. 19 is an enlarged plan view illustrating a weight and a weight film of a vibrating arm (drive arm) of a vibration element according to a fourth embodiment of the invention.
Figure 20:
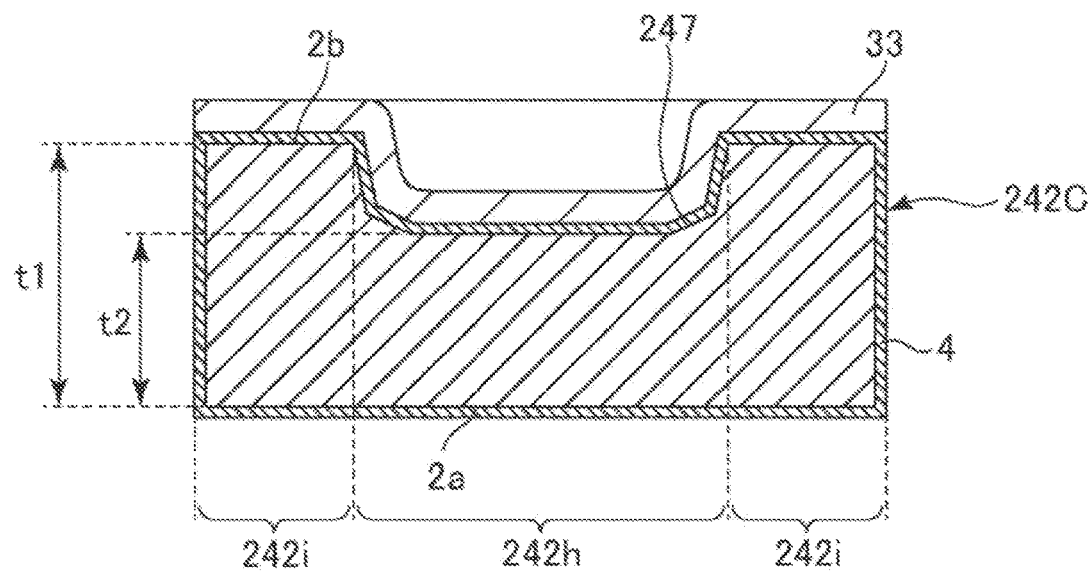
FIG. 20 is a cross-sectional view taken along line B-B in FIG. 19.

FIG. 19 is an enlarged plan view illustrating a weight and a weight film of a vibrating arm (drive arm) of a vibration element according to a fourth embodiment of the invention. FIG. 20 is a cross-sectional view taken along line B-B in FIG. 19.

In the following, a fourth embodiment will be described, but the differences from the embodiments described above will be mainly described, and description of similar matters will be omitted. In FIG. 19 and FIG. 20, the same reference numerals are given to the same components as in the embodiment described above. In the following description, one drive arm will be representatively described, but the same applies to the other drive arms.

This embodiment is the same as the first embodiment described above except that the configuration (shape) of the weight is different.

As illustrated in FIG. 19, a weight 242C of a drive arm 24C included in a vibration element 1C according to this embodiment includes a frame-shaped first portion 242i connected to the arm 241 and a second portion 242h positioned inside the first portion 242i. As illustrated in FIG. 20, the thickness t2 of the second portion 242h is thinner than the thickness t1 of the first portion 242i. Here, the weight film 33 is disposed over the first portion 242i and the second portion 242h in the width direction of the weight 242C.

According to this embodiment as described above, similarly as in the first embodiment, the vibrating characteristics can be improved.

Further, in this embodiment, the first portion 242i surrounds the second portion 242h in a plan view from the thickness direction of the weight 242C. Such a second portion 242h is provided by forming a recess 247. The recess 247 can be formed by etching similarly to the groove 243 described above. For that reason, designing of the second portion 242h becomes easy.

Fifth Embodiment

Figure 21:
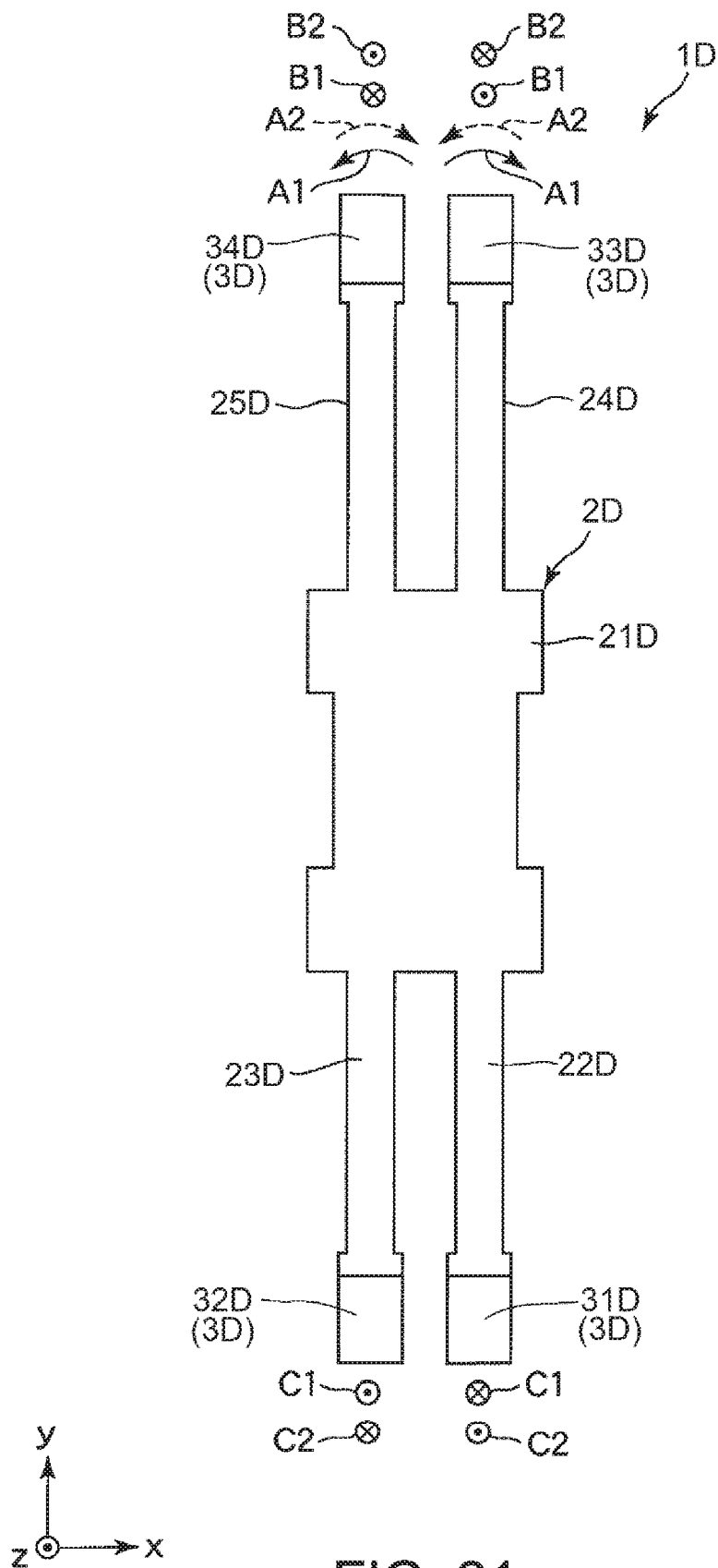
FIG. 21 is a plan view illustrating a vibration element according to a fifth embodiment of the invention.

FIG. 21 is a plan view illustrating a vibration element according to a fifth embodiment of the invention.

In the following, a fifth embodiment will be described, but the differences from the embodiments described above will be mainly described, and description of the same matters will be omitted.

This embodiment is the same as the first embodiment described above except that the invention is applied to a so-called H-type vibration element.

A vibration element 1D illustrated in FIG. 21 is a sensor element that detects an angular velocity around the y-axis. The vibration element 1D includes a vibrator element 2D, and an electrode film (not illustrated) and a weight film 3D provided on the vibrator element 2D.

The vibrator element 2D includes a base 21D, a pair of drive arms 24D and 25D, and a pair of detection arms 22D and 23D. These are integrally formed, and are formed by using a Z-cut quartz crystal plate. The correspondence relationship between the crystal axis of the quartz crystal and the x-axis, the y-axis, and the z-axis is similar to that of the first embodiment described above.

The base 21D is supported by a package 11 which will be described later.

The drive arms 24D and 25D extend from the base 21D in the y-axis direction (+y-direction), respectively. The drive arms 24D and 25D are configured in the same manner as the drive arms of any one of the first to fourth embodiments described above. Similarly to the drive arms 24 to 27 of the first embodiment described above, although not illustrated, a pair of drive electrodes (drive signal electrodes and drive ground electrodes) for bending the drive arms 24D and 25D to vibrate in the x-axis direction by energization are provided on the drive arms 24D and 25D, respectively. The pair of drive electrodes are electrically connected to terminals (not illustrated) on the base 21D via wirings (not illustrated).

The detection arms 22D and 23D extend from the base 21D in the y-axis direction (−y direction), respectively. Although not illustrated, a pair of detection electrodes (a detection signal electrode and a detection ground electrode) for detecting electric charges generated with flexural g vibration in the z-axis direction of the detection arms 22D and 23D are provided on the detection arms 22D and 23D, respectively. The pair of detection electrodes are electrically connected to terminals (not illustrated) on the base 21D via wirings (not illustrated).

The weight film 3D includes weight films 31D and 32D disposed at the tip end portion (weight) of the detection arms 22D and 23D and weight films 33D and 34D disposed on the tip end portion (weight) of the drive arms 24D and 25D.

In the vibration element 1D configured as described above, a drive signal is applied between a pair of drive electrodes, so that the drive arm 24D and the drive arm 25D are subjected to flexural vibration (drive vibration) so as to repeat approaching and separating from each other as indicated by arrows A1 and A2 in FIG. 21.

When the angular velocity ω around the y-axis is applied to the vibration element 1D in a state where the drive arms 24D and 25D are subjected to drive vibration, the drive arms 24D and 25D vibrate in opposite directions in the z-axis direction, as indicated by arrows B1 and B2 in FIG. 21, due to the Coriolis force. Along with this, the detection arms 22D and 23D are subjected to flexural vibration (detection vibration) on opposite sides in the z-axis direction as indicated by arrows C1 and C2 in FIG. 21.

The electric charge generated between the pair of detection electrodes by such flexural vibration of the detection arms 22D and 23D is output from the pair of detection electrodes. Based on such electric charge, the angular velocity Ct) applied to the vibration element 1D can be obtained.

According to this embodiment as described above, similarly as in the first embodiment, the characteristics such as reliability can be improved.

Here, the vibration element 1D according to this embodiment includes the drive arms 24D and 25D which extend from the base 21D and are subjected to drive vibration and detection arms 22D and 23D which extend from the base 21D in the direction opposite to the drive arms 24D and 25D and deform corresponding to the inertial force, and the drive arms 24D and 25D are vibrating arms. With this configuration, the characteristics of a so-called H-type vibration element 1D can be improved.

Sixth Embodiment

Figure 22:
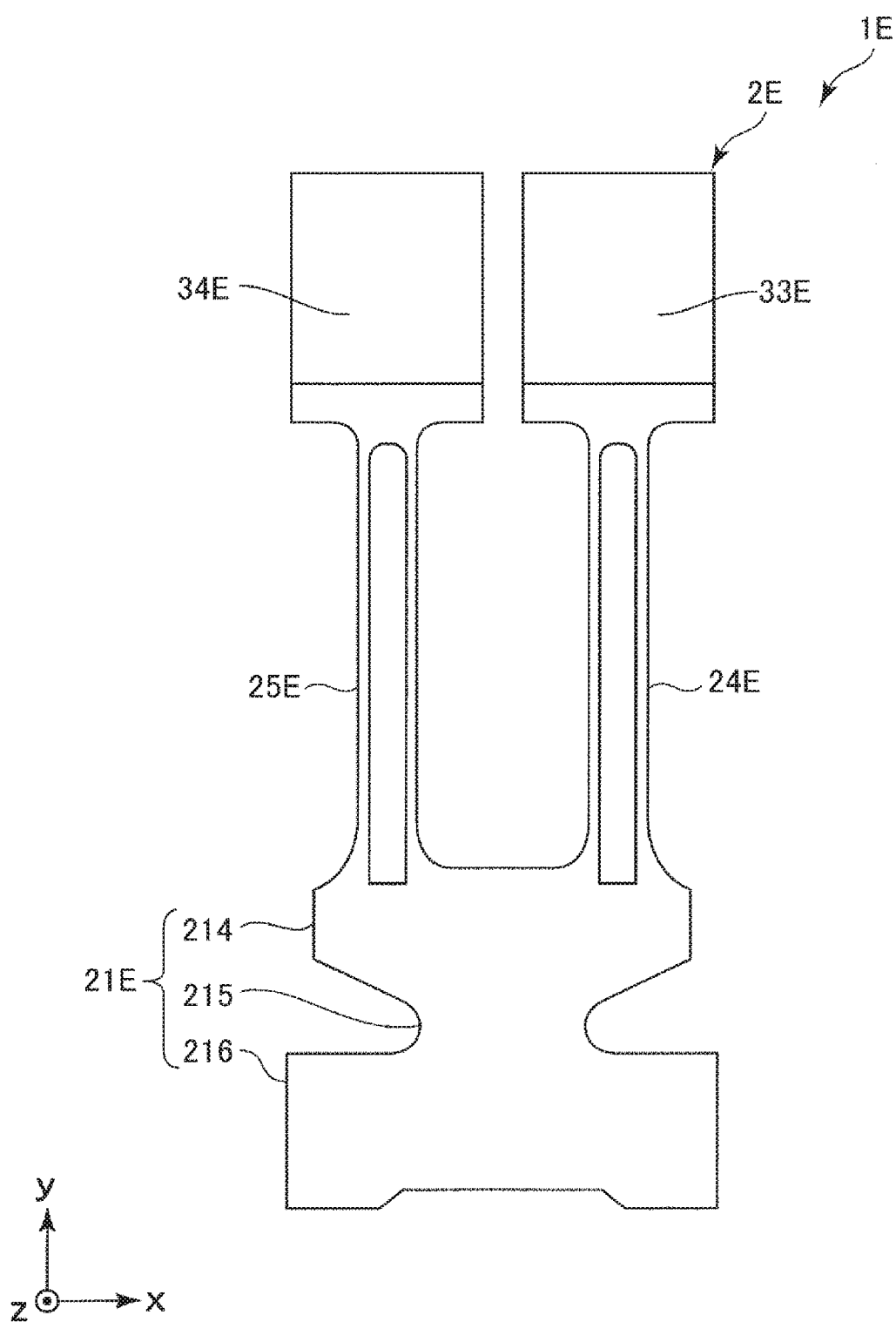
FIG. 22 is a plan view illustrating a vibration element according to a sixth embodiment of the invention.

FIG. 22 is a plan view illustrating a vibration element according to a sixth embodiment of the invention.

In the following, a sixth embodiment will be described, but differences from the embodiments described above will be mainly described, and description of similar matters will be omitted.

This embodiment is the same as the first embodiment described above except that the invention is applied to a so-called two-legged tuning fork type vibration element.

A vibration element 1E illustrated in FIG. 22 is a sensor element that detects an angular velocity around the y-axis. The vibration element 1E includes a vibrator element 2E, an electrode film (not illustrated) and weight films 33E and 34E provided on the vibrator element 2E.

The vibrator element 2E includes a base 21E and a pair of vibrating arms 24E and 25E, which are integrally formed, and are formed using a Z-cut quartz crystal plate. The correspondence relationship between the crystal axis of the quartz crystal and the x-axis, the y-axis, and the z-axis is similar to that of the first embodiment described above.

The base 21E includes a first base 214 to which the vibrating arms 24E and 25E are connected, a second base 216 disposed on the opposite side of the vibrating arms 24E and 25E with respect to the first base 214, and a connector 215 connecting the first base 214 and the second base 216. The connector 215 is positioned between the first base 214 and the second base 216, and has a width (length in the x-axis direction) smaller than that of the first base 214. With this configuration, it is possible to reduce vibration leakage while reducing the length of the base 21E along the y-axis direction. Here, the second base 216 is supported by, for example, a package 11 which will be described later.

The vibrating arms 24E and 25E respectively extend in the y-axis direction (+y-direction) from the base 21E. The vibrating arms 24E and 25E are configured similarly to the drive arms of any one of the first to fourth embodiments described above. Similarly to the drive arms 24 to 27 of the first embodiment described above, although not illustrated, a pair of drive electrodes (drive signal electrodes and drive ground electrodes) for bending the vibrating arms 24E and 25E to vibrate in the x-axis direction by energization are provided on the vibrating arms 24E and 25E, respectively. The pair of drive electrodes are electrically connected to terminals (not illustrated) on the base 21E via wirings (not illustrated).

Although not illustrated, in addition to the pair of drive electrodes described above, a pair of detection electrodes (a detection signal electrode and a detection ground electrode) for detecting electric charges generated with flexural g vibration in the z-axis direction of the vibrating arms 24E and 25E are provided on the vibrating arms 24E and 25E, respectively. The pair of detection electrodes are electrically connected to terminals (not illustrated) on the base 21E via wirings (not illustrated).

The weight films 33E and 34E are disposed on the tip end portions (weights) of the vibrating arms 24E and 25E. In the vibration element 1E configured as described above, a drive signal is applied between a pair of drive electrodes, so that the vibrating arm 24E and the vibrating arm 25E are subjected to flexural g vibration (drive vibration) so as to repeat approaching and separating from each other.

When the angular velocity ω around the y-axis is applied to the vibration element 1E in a state where the vibrating arms 24E and 25E are subjected to drive vibration, vibrations bending in opposite directions in the z-axis direction are excited by the Coriolis force to the vibrating arms 24E and 25E. The electric charge generated between the pair of detection electrodes due to the vibration excited in this manner is output from the pair of detection electrodes. Based on such electric charge, the angular velocity ω applied to the vibration element 1E can be obtained.

According to this embodiment as described above, as in the first embodiment, the vibrating characteristics can be improved.

2. Physical Quantity Sensor

Figure 23:
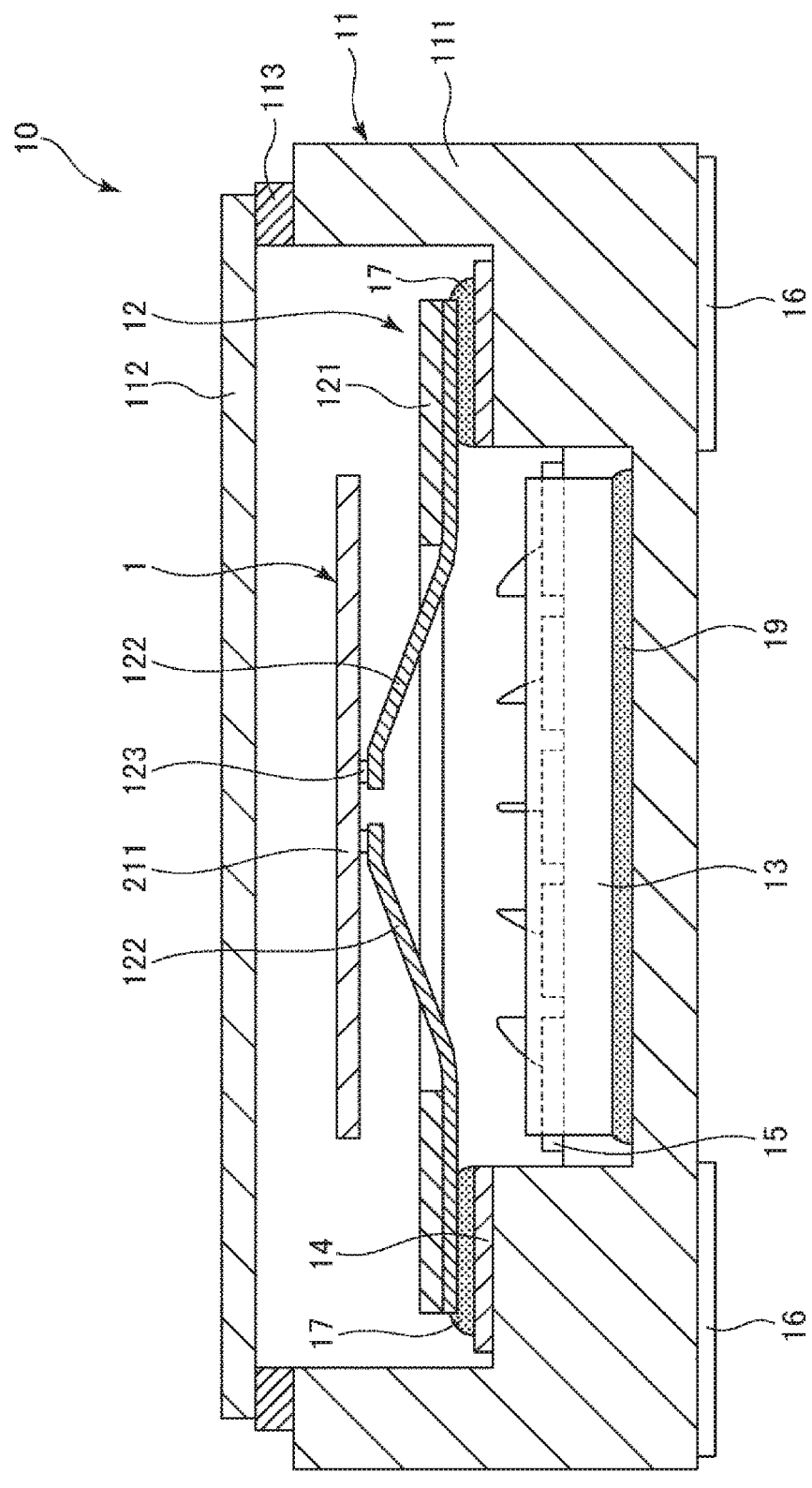
FIG. 23 is a cross-sectional view illustrating a physical quantity sensor according to an embodiment of the invention.

FIG. 23 is a cross-sectional view illustrating a physical quantity sensor according to an embodiment of the invention.

A physical quantity sensor 10 illustrated in FIG. 23 is a vibration gyro sensor that detects an angular velocity around the x-axis, the y-axis, or the z-axis. This physical quantity sensor 10 includes a vibration element 1 (or 1A, 1B, 1C, 1D, 1E), a support member 12, a circuit element 13 (integrated circuit chip), and a package 11 that accommodates these constitutional elements.

The package 11 includes a box-like base 111 having a recess for accommodating the vibration element 1 and a plate-like lid 112 joined to the base 111 via a joining member 113 so as to close an opening of the recess of the base 111. Inside of the package 11 may be in a depressurized (vacuum) state or may be enclosed with inert gas such as nitrogen, helium, argon or the like.

The recess of the base 111 has an upper stage surface positioned on the opening side, a lower stage surface positioned on the bottom side, and a middle stage surface positioned between the upper and lower stage surfaces. The constituent material of the base 111 is not particularly limited, but various ceramics such as aluminum oxide and various glass materials can be used. The constituent material of a lid 112 is not particularly limited, but it may be a member having a coefficient of linear expansion close to that of the constituent material of the base 111. For example, in a case where the constituent material of the base 111 is ceramics as described above, it is preferable to use an alloy such as kovar. In this embodiment, a seam ring is used as the joining member 113, but the joining member 113 may be configured by using, for example, low melting point glass, an adhesive, or the like.

A plurality of connection terminals 14 and 15 are provided on the upper stage surface and the middle stage surface of the recess of the base 111, respectively. A part of the plurality of connection terminals 15 provided on the middle stage surface is electrically connected to a terminal 16 provided on the bottom surface of the base 111 via a wiring layer (not illustrated) provided on the base 111, and the remaining part is electrically connected to the plurality of connection terminals 14 provided on the upper stage via wirings (not illustrated). These connection terminals 14 and 15 are not particularly limited as long as they have conductivity, but are constituted by a metallic coating film obtained by laminating films of Ni (nickel), Au (gold), Ag (silver), Cu (copper), or the like on a metallization layer (underlayer) of Cr (chromium), W (tungsten) or the like.

The circuit element 13 is fixed to the lower stage surface of the recess of the base 111 with an adhesive 19 or the like. As the adhesive 19, for example, an epoxy-based, silicone-based, or polyimide-based adhesive can be used. The circuit element 13 includes a plurality of terminals (not illustrated), and these terminals are electrically connected to the respective connection terminals 15 provided on the middle stage surface described above by conductive wires. This circuit element 13 includes a drive circuit for allowing the vibration element 1 to be subjected to drive vibration and a detection circuit for detecting the detection vibration occurring in the vibration element 1 when an angular velocity is applied.

The support member 12 is connected to the plurality of connection terminals 14 provided on the upper stage surface of the recess of the base 111 via a conductive adhesive 17. The support member 12 includes a wiring pattern 122 connected to the conductive adhesive 17 and a support substrate 121 supporting the wiring pattern 122. As the conductive adhesive 17, for example, a conductive adhesive such as an epoxy-based adhesive, a silicone-based adhesive, a polyimide-based adhesive or the like mixed with a conductive substance such as a metal filler can be used.

The support substrate 121 has an opening at the center portion, and a plurality of elongated leads included in the wiring pattern 122 extend in the opening. The vibration element 1 is connected to the tip end portions of these leads via conductive bumps 123.

In this embodiment, the circuit element 13 is provided inside the package 11, but the circuit element 13 may be provided outside the package 11.

As described above, the physical quantity sensor 10 includes the vibration element 1 (or 1A, 1B, 1C, 1D, 1E) and the package 11 accommodating the vibration element 1 (or 1A, 1 B, 1C, 1D, 1E). According to such a physical quantity sensor 10, it is possible to improve the sensor characteristics (for example, detection accuracy) of the physical quantity sensor 10 by utilizing the excellent characteristics of the vibration element 1 (or 1A, 1B, 1C, 1D, 1E).

3. Inertial Measurement Device

Figure 24:
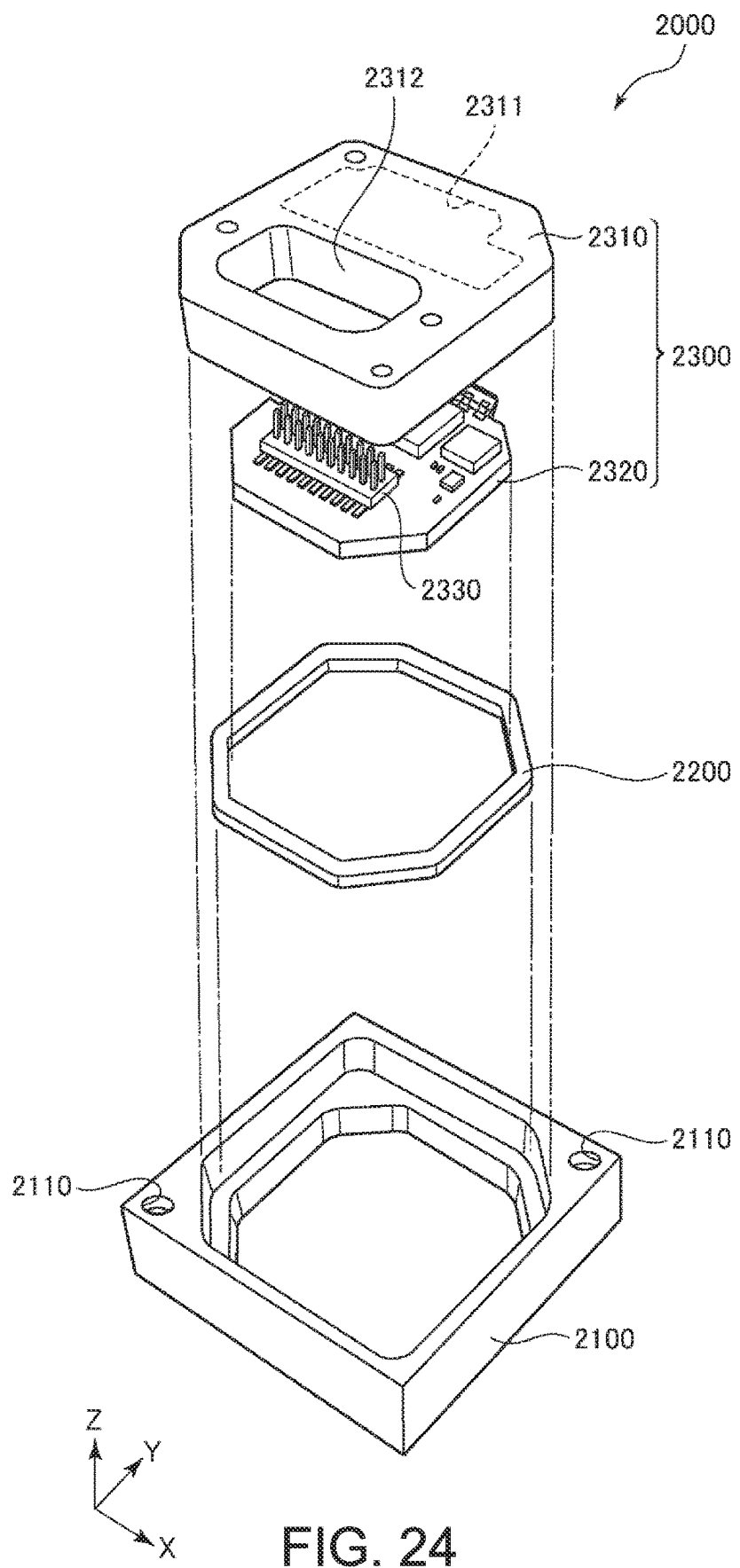
FIG. 24 is an exploded perspective view illustrating an embodiment of an inertial measurement device according to the invention.
Figure 25:
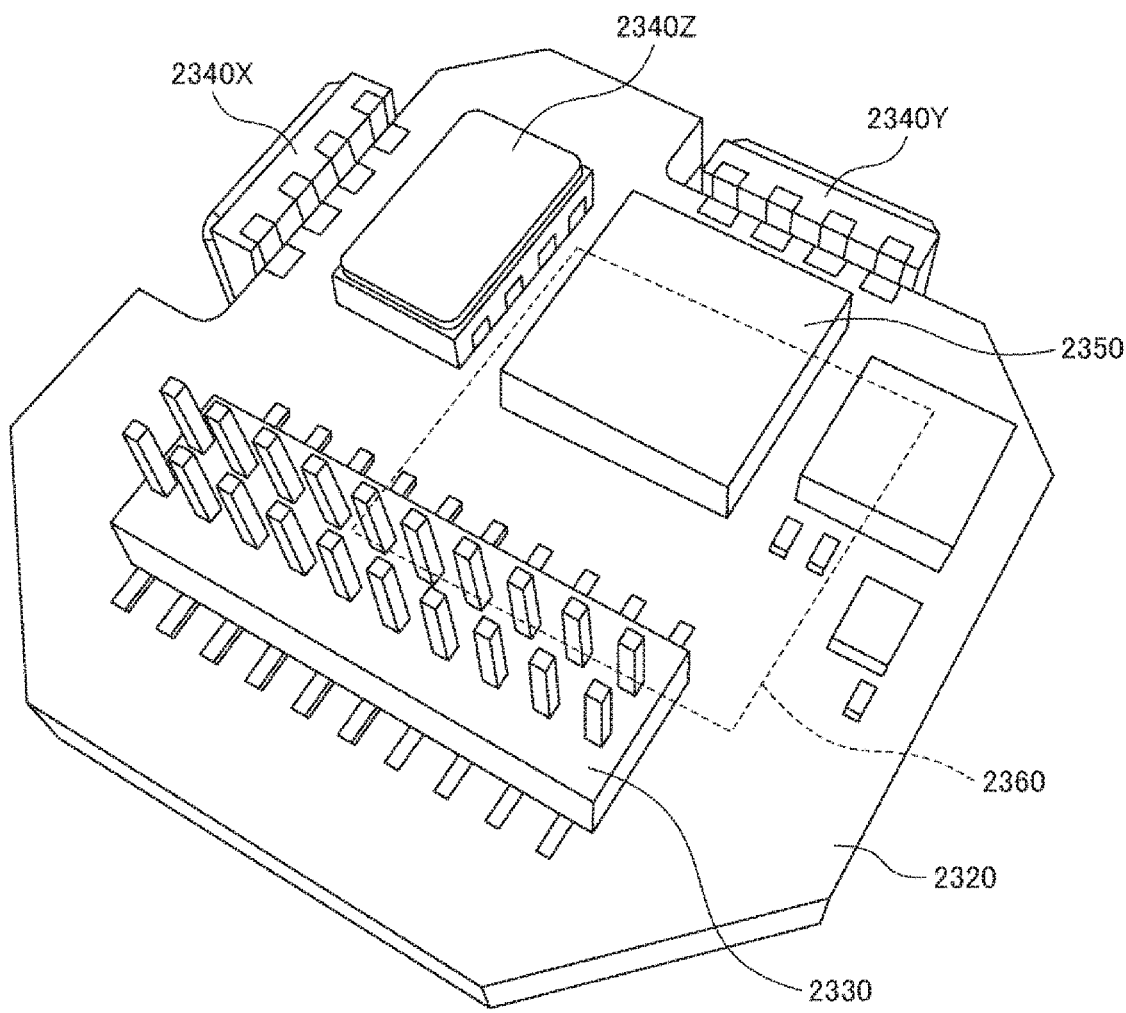
FIG. 25 is a perspective view of a substrate included in the inertial measurement device illustrated in FIG. 24.

FIG. 24 is an exploded perspective view illustrating an embodiment of the inertial measurement device according to the invention. FIG. 25 is a perspective view of a substrate included in the inertial measurement device illustrated in FIG. 24.

An inertial measurement device (which corresponds to inertial measurement unit (IMU)) 2000 illustrated in FIG. 24 is a so-called six-axis motion sensor, is used by being attached to a vehicle (measurement target) such as an automobile, a robot, and detects an attitude and behavior (inertial momentum) of the vehicle detected.

The inertial measurement device 2000 includes an outer case 2100, a joining member 2200, and a sensor module 2300. The sensor module 2300 is engaged (inserted) in the outer case 2100 in a state where the joining member 2200 is interposed.

The outer case 2100 has a box-like shape, and two corner portions at diagonal corners of the outer case 2100 are provided with screw holes 2110 for screwing the measurement target.

The sensor module 2300 includes an inner case 2310 and a substrate 2320. The sensor module 2300 is accommodated inside the outer case 2100 in a state where the inner case 2310 supports the substrate 2320. Here, the inner case 2310 is joined to the outer case 2100 with an adhesive or the like via the joining member 2200 (for example, a rubber packing). The inner case 2310 has a recess 2311 functioning as a storage space for components to be mounted on the substrate 2320 and an opening 2312 for exposing the connector 2330 provided on the substrate 2320 to the outside. The substrate 2320 is, for example, a multilayer wiring board, and is joined to the inner case 2310 with an adhesive or the like.

As illustrated in FIG. 25, a connector 2330, angular velocity sensors 2340X, 2340Y, and 2340Z, an acceleration sensor 2350, and a control IC 2360 are mounted on the substrate 2320.

The connector 2330 is electrically connected to an external device (not illustrated), and is used to transmit and receive electric signals such as electric power and measurement data between the external device and the inertial measurement device 2000.

The angular velocity sensor 2340X detects the angular velocity around the X-axis, the angular velocity sensor 2340Y detects the angular velocity around the Y-axis, and the angular velocity sensor 2340Z detects the angular velocity around the Z-axis. Here, each of the angular velocity sensors 2340X, 2340Y, and 2340Z is the physical quantity sensor 10 described above. Further, the acceleration sensor 2350 is, for example, an acceleration sensor formed by using the MEMS technology and detects acceleration in each of the X-axis, Y-axis, and Z-axis directions.

The control IC 2360 is a micro controller unit (MCU), incorporates a storage unit including a nonvolatile memory, an A/D converter, and the like, and controls each portion of the inertial measurement device 2000. Here, the storage unit stores a program that defines the order and contents for detecting acceleration and angular velocity, a program that digitizes detection data to be incorporated into packet data, accompanying data, and the like.

As described above, the inertial measurement device 2000 includes the physical quantity sensor 10 and the control IC 2360 which is a circuit electrically connected to the physical quantity sensor 10. According to such an inertial measurement device 2000, it is possible to improve characteristics (for example, measurement accuracy) of the inertial measurement device 2000 by using excellent sensor characteristics of the physical quantity sensor 10.

4. Electronic Apparatus

Figure 26:
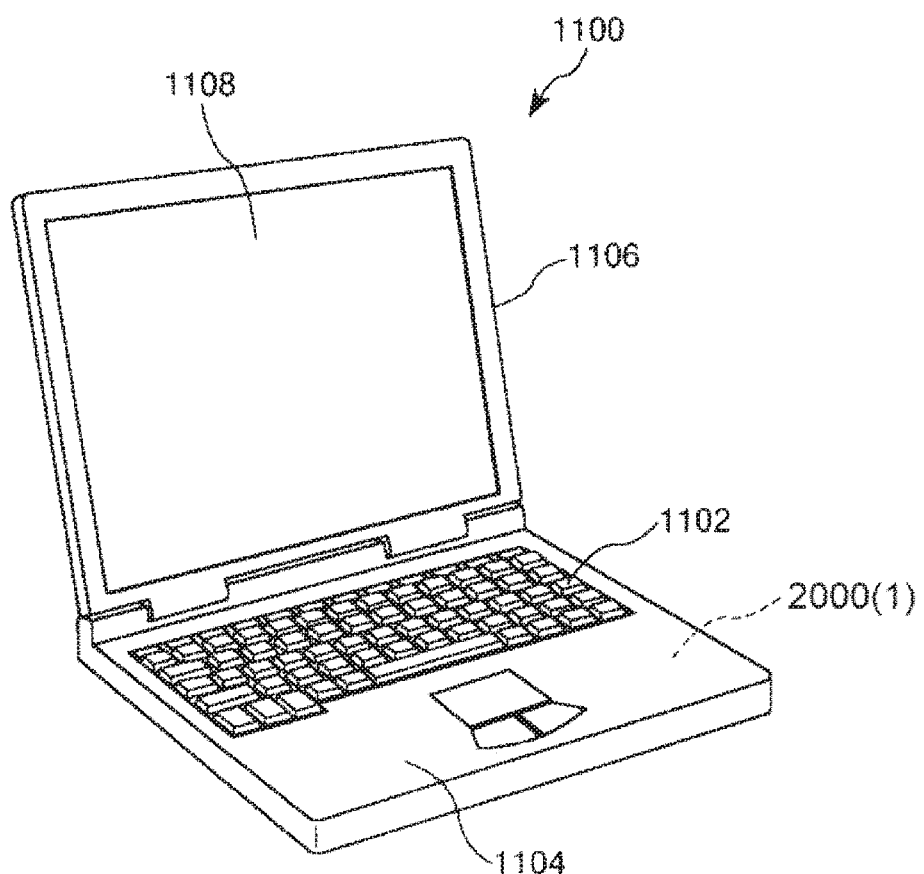
FIG. 26 is a perspective view illustrating an embodiment (a mobile type (or notebook type) personal computer) of an electronic apparatus according to the invention.

FIG. 26 is a perspective view illustrating an embodiment (mobile type (or notebook type) personal computer) of an electronic apparatus according to the invention.

In FIG. 26, a personal computer 1100 is constituted by a main body 1104 provided with a keyboard 1102 and a display unit 1106 provided with a display part 1108, and the display unit 1106 is rotatably supported to the main body 1104 via a hinge structure. In such a personal computer 1100, an inertial measurement device 2000 including the vibration element 1 (or 1A, 1B, 1C, 1D, 1E) described above is incorporated.

Figure 27:
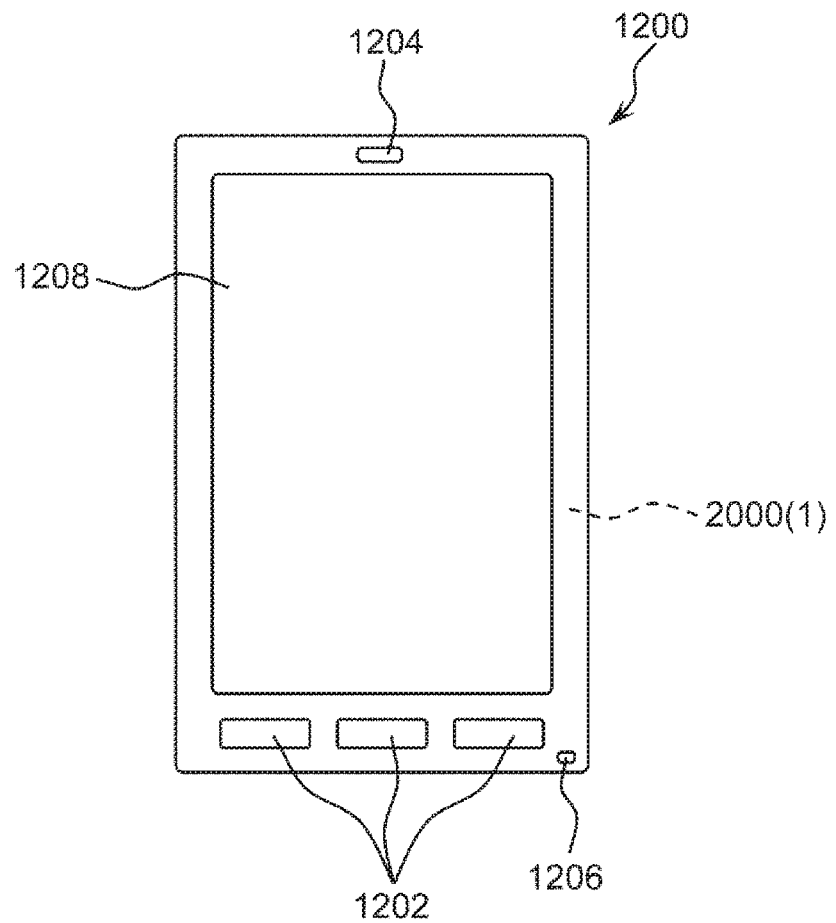
FIG. 27 is a plan view illustrating an embodiment (mobile phone) of the electronic apparatus according to the invention.

FIG. 27 is a plan view illustrating an embodiment (mobile phone) of the electronic apparatus according to the invention. In FIG. 27, a mobile phone 1200 includes an antenna (not illustrated), a plurality of operation buttons 1202, an earpiece 1204, and a mouthpiece 1206, and a display unit 1208 is disposed between the operation button 1202 and the earpiece 1204. In such a mobile phone 1200 the inertial measurement device 2000 including the vibration element 1 (or 1A, 1B, 1C, 1D, 1E) described above is incorporated.

Figure 28:
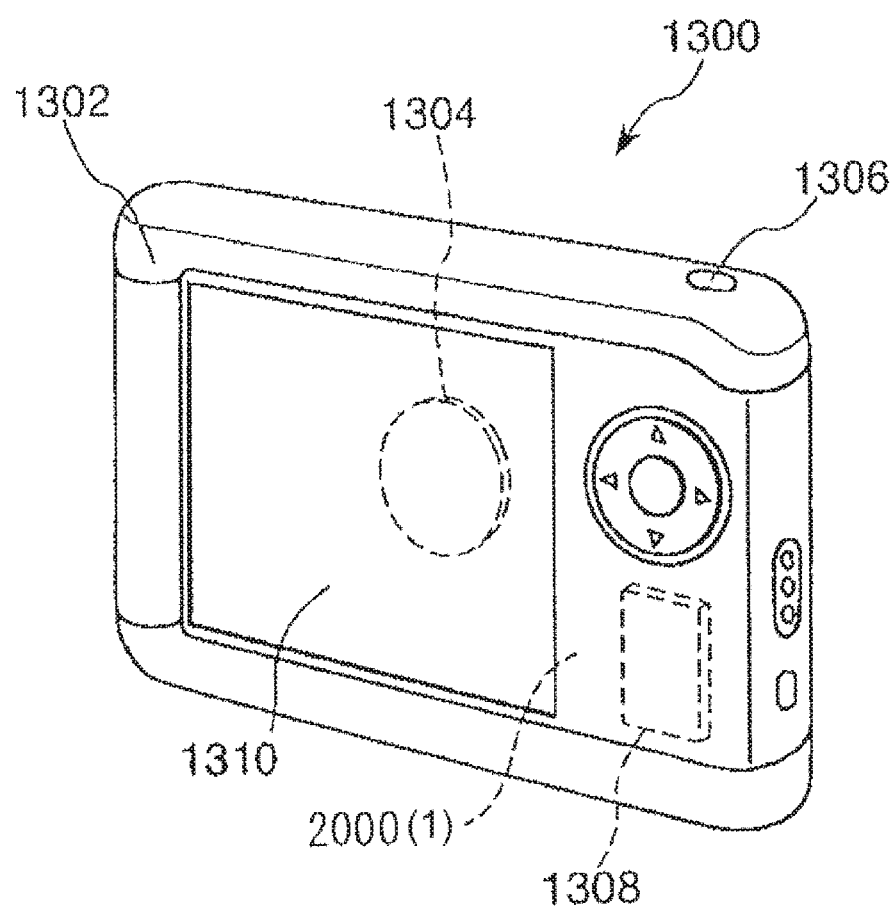
FIG. 28 is a perspective view illustrating an embodiment (digital still camera) of the electronic apparatus according to the invention.

FIG. 28 is a perspective view illustrating an embodiment (digital still camera) of the electronic apparatus according to the invention.

A display portion 1310 is provided on the back surface of a case 1302 in a digital still camera 1300 and is configured to perform display based on an imaging signal of a CCD, and the display portion 1310 functions as a viewfinder for displaying a subject as an electronic image. A light receiving unit 1304 including an optical lens (image-capturing optical system), a CCD or the like is provided on a front side (back side in the figure) of the case 1302. When a photographer confirms a subject image displayed on the display portion 1310 and presses a shutter button 1306, an image-capturing signal of the CCD at that time is transferred to be stored in the memory 1308. In such a digital still camera 1300, the inertial measurement device 2000 including the vibration element 1 (or 1A, 1B, 1C, 1D, 1E) described above, and the measurement result of the inertial measurement device 2000 is used for camera shake correction, for example.

The electronic apparatus as described above includes the vibration element 1 (or 1A, 1B, 1C, 1D, 1E). According to such an electronic apparatus, it is possible to improve the characteristics (for example, reliability) of the electronic apparatus by utilizing the excellent characteristics of the vibration element 1 (or 1A, 1B, 1C, 1D, 1E).

In addition to the personal computer of FIG. 26, the mobile phone of FIG. 27, and the digital still camera of FIG. 28, the electronic apparatus may be applied to, for example, a smartphone, a tablet terminal, a clock (including a smart watch), an ink jet type ejecting device (for example, an ink jet printer), a wearable terminal such as a head mounted display (HMD) a laptop type personal computer, a television, a video camera, a video tape recorder, a car navigation device, a pager, an electronic notebook (including electronic notebook with a communication function), an electronic dictionary, a calculator, an electronic game device, a word processor, a workstation, a video phone, a TV monitor for crime prevention, an electronic binocular, a POS terminal, a medical device (for example, an electronic thermometer, a blood pressure monitor, a blood glucose meter, an electrocardiogram measuring device, an ultrasonic diagnostic device, an electronic endoscope), a fish finder, various measuring instruments, instruments (for example, instruments of an automobile, aircraft, rocket, and a ship), a base station for a portable terminal, a flight simulator, and the like.

5. Vehicle

Figure 29:
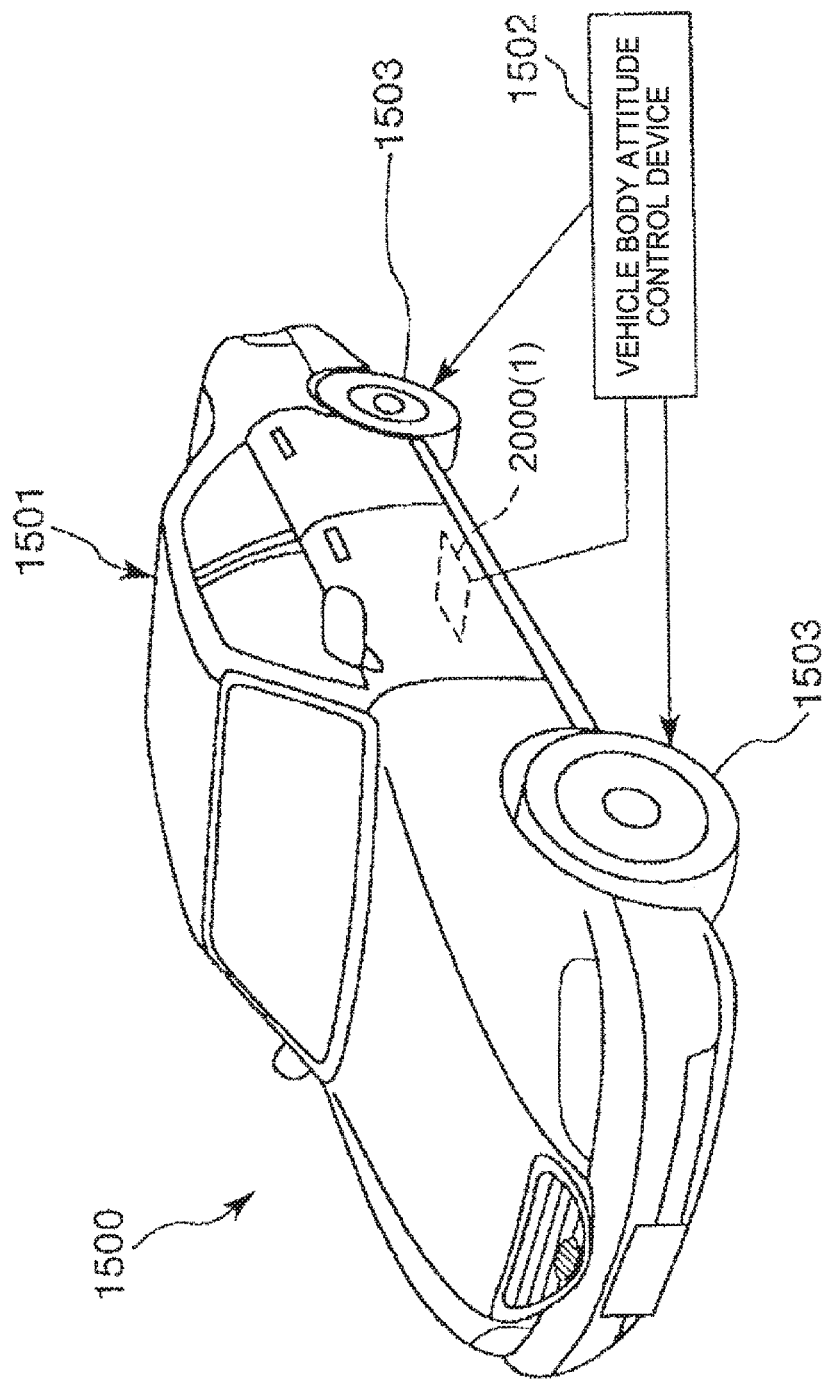
FIG. 29 is a perspective view illustrating an embodiment (automobile) of a vehicle according to the invention.

FIG. 29 is a perspective view illustrating an embodiment (automobile) of a vehicle according to the invention.

In an automobile 1500, the inertial measurement device 2000 including the vibration element 1 (or 1A, 1B, 1C, 1D, 1E) described above is incorporated, and an attitude of a vehicle body 1501 can be detected by the inertial measurement device 2000, for example. The detection signal of the inertial measurement device 2000 is supplied to a vehicle body attitude control device 1502. The vehicle body attitude control device 1502 can detect the attitude of the vehicle body 1501 based on the detection signal and control hardness and softness of a suspension according to the detection result or control brakes of individual wheels 1503.

In addition, such attitude control can be utilized for a two-leg walking robot and a radio control helicopter (including drone). As described above, in order to realize attitude control of the vehicles, the inertia measurement device 2000 is incorporated.

As described above, the automobile 1500 which is a vehicle includes the vibration element 1 (or 1A, 1B, 1C, 1D, 1E). According to such an automobile 1500, it is possible to improve characteristics (for example, reliability) of the automobile 1500 by utilizing excellent characteristics of the vibration element 1 (or 1A, 1B, 1C, 1D, 1E).

Although the vibration element, the manufacturing method of the vibration element, the physical quantity sensor, the inertial measurement device, the electronic apparatus, and the vehicle according to the invention have been described based on the illustrated embodiments, the invention is not limited thereto, and the configuration of each unit can be replaced with any configuration having the same function. Further, any other constituent elements may be added to the invention.

In the embodiments described above, the vibration element has a so-called double T-shape, H-shape, or two-legged tuning fork shape, but any device having a vibrating arm that vibrates in the in-plane direction may be used, and various forms, for example, a three-legged tuning fork vibration element, an orthogonal type vibration element, a prismatic type vibration element, and the like may be adopted.

The entire disclosure of Japanese Patent Application No. 2018-009173 filed Jan. 23, 2018 is expressly incorporated herein by reference.

What is claimed is:

1. A vibration element comprising:
   three axes orthogonal to each other being defined as an X-axis, a Y-axis, and a Z-axis;
   a base; and
   a vibrating arm extending from the base to a positive side of the Y-axis, wherein the vibrating arm is configured with:
      a weight;
      an arm positioned between the base and the weight; and
      a weight film disposed on the weight, the weight includes a first principal surface and a second principal surface that are perpendicular to the Z-axis and have a front and back relationship with each other,
   wherein a plane passing through a center of the arm in a Z-axis direction along the Z-axis and parallel to an X-Y plane containing the X-axis and the Y-axis is defined as a center plane,
   a center of gravity of the weight is on a first principal surface side with respect to the center plane, and
   a center of gravity of the weight film is on a second principal surface side with respect to the center surface,
   wherein the weight includes a first portion and a second portion, and the second portion is thinner than the first portion in the Z-axis direction,
   wherein the second principal surface has a stepped shape formed by the first portion and the second portion, and
   the second portion is arranged in a region from an end of the first portion on the positive side of the Y axis to an end of the weight on the positive side of the Y axis in a plan view from the Z-axis direction.

2. The vibration element according to claim 1, wherein the weight film is positioned on a second principal surface side of the weight.

3. The vibration element according to claim 2, wherein the weight film is positioned on the first portion and the second portion.

4. The vibration element according to claim 1, wherein a width of the weight in an X-axis direction along the X-axis is wider than a width of the arm in the X-axis direction in the plan view from the Z-axis direction.

5. The vibration element according to claim 1, wherein the first principal surface is a flat surface.

6. The vibration element according to claim 1, wherein the arm is plane-symmetric with respect to the center plane.

7. The vibration element according to claim 1, wherein the arm a first arm, the weight is a first weight, the vibrating arm is a first vibrating arm, and the weight film is a first weight film,
   and further comprising:
      a second vibrating arm extending from the base to the positive side of the Y axis,
      wherein the second vibrating arm is configured with:
         a second weight;
         a second arm positioned between the base and the second weight; and
         a second weight film disposed on the second weight, the second weight includes a third principal surface and a fourth principal surface that are perpendicular to the Z-axis and have a front and back relationship with each other,
   wherein a plane passing through a center of the second arm in the Z-axis direction and parallel to the X-Y plane containing the X-axis and the Y-axis is defined as a second center plane,
   a center of gravity of the second weight is on a third principal surface side with respect to the second center plane, and
   a center of gravity of the second weight film is on a fourth principal surface side with respect to the second center plane,
   wherein the second weight includes a third portion and a fourth portion, and the fourth portion is thinner than the third portion in the Z-axis direction,
   wherein the fourth principal surface has a stepped shape formed by the third portion and the fourth portion, and
   the fourth portion is arranged in a region from an end of the third portion on the positive side of the Y axis to an end of the second weight on the positive side of the Y axis in the plan view from the Z-axis direction.

8. The vibration element according to claim 7, wherein the base is configured with:
   a base body; and
   a connecting arm extending from the base body,
   and further comprising:
      a drive arm that extends from the connecting arm and that is subjected to drive vibration; and
      a detection arm extending from the base body and deforming in response to inertial force;
   wherein the drive arm includes the first vibrating arm and the second vibrating arm.

9. The vibration element according to claim 7, further comprising:
   a drive arm extending from the base and that is subjected to drive vibration; and
   a detection arm extending from the base to a negative side of the Y axis and deforming in response to inertial force;
   wherein the drive arm includes the first vibrating arm and the second vibrating arm.

10. The vibration element according to claim 1, wherein the weight film comprises:
    a film thickness portion; and
    a film thin portion that is thinner than the film thickness portion.

11. A physical quantity sensor comprising:
    the vibration element according to claim 1; and
    a package which accommodates the vibration element.

12. An inertial measurement unit comprising:
    the physical quantity sensor according to claim 11; and
    a circuit which is electrically connected to the physical quantity sensor.

13. An electronic apparatus comprising:
    the vibration element according to claim 1.

14. A vehicle comprising:
    the vibration element to claim 1.

* * * * *